(12) United States Patent
Dewey et al.

(10) Patent No.: US 10,084,043 B2
(45) Date of Patent: Sep. 25, 2018

(54) HIGH MOBILITY NANOWIRE FIN CHANNEL ON SILICON SUBSTRATE FORMED USING SACRIFICIAL SUB-FIN

(71) Applicant: INTEL CORPORATION, Santa Clara, CA (US)

(72) Inventors: Gilbert Dewey, Hillsboro, OR (US);
Matthew V. Metz, Portland, OR (US);
Jack T. Kavalieros, Portland, OR (US);
Willy Rachmady, Beaverton, OR (US);
Tahir Ghani, Portland, OR (US);
Anand S. Murthy, Portland, OR (US);
Chandra S. Mohapatra, Beaverton, OR (US); Sanaz K. Gardner, Hillsboro, OR (US); Marko Radosavljevic, Beaverton, OR (US); Glenn A. Glass, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/525,269

(22) PCT Filed: Dec. 26, 2014

(86) PCT No.: PCT/US2014/072448
§ 371 (c)(1),
(2) Date: May 8, 2017

(87) PCT Pub. No.: WO2016/105437
PCT Pub. Date: Jun. 30, 2016

(65) Prior Publication Data
US 2017/0358645 A1    Dec. 14, 2017

(51) Int. Cl.
*H01L 29/06* (2006.01)
*H01L 21/02* (2006.01)
(Continued)

(52) U.S. Cl.
CPC .... *H01L 29/0673* (2013.01); *H01L 21/02603* (2013.01); *H01L 21/02639* (2013.01);
(Continued)

(58) Field of Classification Search
CPC ........... H01L 29/0673; H01L 21/30604; H01L 29/66469; H01L 29/122; H01L 29/785;
(Continued)

(56) References Cited

U.S. PATENT DOCUMENTS 8,324,660 B2 * 12/2012 Lochtefeld ........ H01L 21/02381
257/190
8,779,554 B2 * 7/2014 Vellianitis ......... H01L 21/76264
257/190
(Continued)

FOREIGN PATENT DOCUMENTS

EP       3238265 A1    11/2017
KR    10-1412911 B1     6/2014
(Continued)

OTHER PUBLICATIONS

International Searching Authority at the Korean Intellectual Property Office, International Search Report and Written Opinion for International Patent Application No. PCT/US2014/072448, dated Sep. 25, 2015, 11 pages.
(Continued)

*Primary Examiner* — Roy Potter
*Assistant Examiner* — Paul Patton
(74) *Attorney, Agent, or Firm* — Schwabe, Williamson & Wyatt P.C.

(57) ABSTRACT

An integrated circuit die includes a quad-gate device nanowire of channel material for a transistor (e.g., single material or stack to be a channel of a MOS device) formed by removing a portion of a sub-fin material from below the channel material, where the sub-fin material was grown in an
(Continued)

aspect ration trapping (ART) trench. In some cases, in the formation of such nanowires, it is possible to remove the defective fin material or area under the channel. Such removal isolates the fin channel, removes the fin defects and leakage paths, and forms the nanowire of channel material having four exposed surfaces upon which gate material may be formed.

21 Claims, 9 Drawing Sheets

(51) Int. Cl.
*H01L 21/311* (2006.01)
*H01L 29/66* (2006.01)
*H01L 21/306* (2006.01)
*H01L 21/762* (2006.01)
*H01L 29/78* (2006.01)
*H01L 29/12* (2006.01)
*H01L 29/775* (2006.01)
*H01L 29/04* (2006.01)
*H01L 29/20* (2006.01)
*H01L 29/161* (2006.01)

(52) U.S. Cl.
CPC .. *H01L 21/30604* (2013.01); *H01L 21/31111* (2013.01); *H01L 21/76224* (2013.01); *H01L 29/0649* (2013.01); *H01L 29/122* (2013.01); *H01L 29/66469* (2013.01); *H01L 29/66795* (2013.01); *H01L 29/775* (2013.01); *H01L 29/785* (2013.01); *H01L 21/0245* (2013.01); *H01L 21/02381* (2013.01); *H01L 21/02461* (2013.01); *H01L 21/02532* (2013.01); *H01L 21/02546* (2013.01); *H01L 29/045* (2013.01); *H01L 29/161* (2013.01); *H01L 29/20* (2013.01)

(58) Field of Classification Search
CPC ............. H01L 21/76224; H01L 29/775; H01L 29/66795; H01L 29/0649; H01L 21/31111; H01L 21/02603; H01L 21/02639; H01L 21/02546
See application file for complete search history.

(56) References Cited

U.S. PATENT DOCUMENTS

| | | | |
|---|---|---|---|
| 8,823,102 | B2 | 9/2014 | Van Dal et al. |
| 9,385,198 | B2 | 7/2016 | Holland et al. |
| 2011/0049568 | A1 | 3/2011 | Lochtefeld et al. |
| 2013/0075811 | A1 | 3/2013 | Wang et al. |
| 2013/0256784 | A1 | 10/2013 | Vellianitis et al. |
| 2013/0341704 | A1* | 12/2013 | Rachmady ........ H01L 29/66545 257/327 |
| 2014/0091360 | A1 | 4/2014 | Pillarisetty et al. |
| 2014/0299885 | A1* | 10/2014 | Lee .................. H01L 29/20 257/76 |
| 2014/0329376 | A1 | 11/2014 | Sanchez et al. |

FOREIGN PATENT DOCUMENTS

| | | |
|---|---|---|
| KR | 10-2014-0111926 A | 9/2014 |
| WO | WO 2016105384 | 6/2016 |

OTHER PUBLICATIONS

European Search Report from European Patent Application No. 14909269.4, dated Jul. 16, 2018, 9 pages.

* cited by examiner

HIGH MOBILITY NANOWIRE FIN CHANNEL ON SILICON SUBSTRATE FORMED USING SACRIFICIAL SUB-FIN

CROSS-REFERENCE TO RELATED APPLICATION

This patent application is a U.S. National Phase Application under 35 U.S.C. § 371 of International Application No. PCT/US2014/072448, filed Dec. 26, 2014, entitled HIGH MOBILITY NANOWIRE FIN CHANNEL ON SILICON SUBSTRATE FORMED USING SACRIFICIAL SUB-FIN.

BACKGROUND

Field

Circuit devices and the manufacture and structure of fin based circuit devices.

Description of Related Art

Increased performance in and yield of circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (n-MOS) channels and to increase movement of positive charged holes in P-type MOS device (p-MOS) channels. In some cases, to increase such movement, lattice mismatched channel materials like type III-V and IV chemical element material are epitaxial growth on Silicon to induce strain in the mismatched channel material. This allows the formation of high mobility channels of type III-V and Germanium that are not lattice matched to the Si substrate.

However, due to such large lattice mismatch in materials, crystalline defects are generated when novel materials (e.g., type III-V and IV (e.g., Silicon, Germanium)) are grown on a Silicon material substrate. Performance and electron/hole movement are slowed by such lattice mismatches and defects generated in between layers of materials used to form the channels.

DETAILED DESCRIPTION

Figure 1:
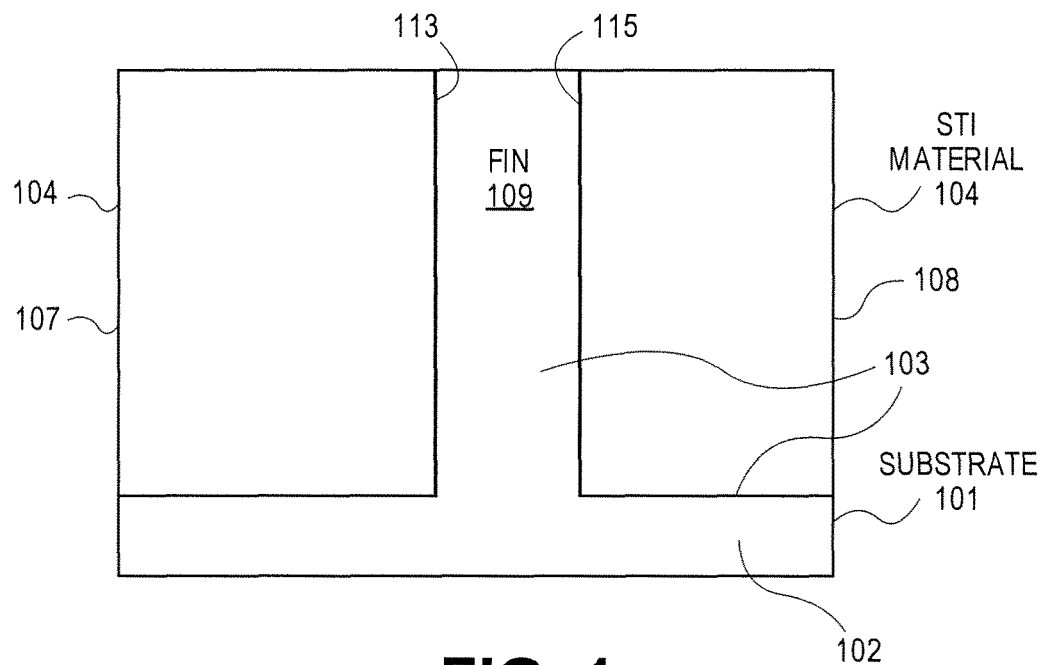
FIG. 1 is a schematic cross section view of a portion of a semiconductor substrate base having fin after forming a layer of shallow trench isolation (STI) material on a top surface of the substrate and around the fin.

Large lattice mismatch in materials may generate defects when certain materials (e.g., type III-V and IV (e.g., Silicon (Si) and Germanium (Ge)) atomic element materials) are epitaxially grown on a Silicon material substrate (e.g., single crystal silicon). In some cases, the materials may be epitaxially grown from a substrate surface, in trenches between shallow trench isolation (STI) regions. The growth may be patterned and etched to form "fins" of material in or on which devices may be formed. Thus, the defects may exist in "fins" of material in or on which devices may be formed, after the fins are patterned and etched from the growths. If these defects propagate throughout the trench, they can lead to yield and variations issues in a device built on a device layer formed from epitaxial growth extending above the trench. This propagation may exist in "fin" devices formed in fins that are patterned and etched from epitaxial growth extending above the trench. Such fin devices may include fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type (e.g., doped to have electron charge carriers) MOS device (n-MOS) channels and movement of positive charged holes in P-type (e.g., doped to have hole charge carriers) MOS device (p-MOS) channels.

Embodiments describe herein provide a solution to processes that trap defects only in one direction of the fin (along width W, such as shown in FIG. 2-6). The solution may include a process that uses the concept of aspect ratio trapping where Height (H) of the fin is larger than the width (W). However this scheme leaves large number of defects propagating towards the device layers in the long direction of the fin. According to embodiments, such defects can be avoided by trapping defects along the sidewall of the STI forming the trenches (e.g., in both the W an length L directions) by making the Height (H) of the trench larger than the width (W) and length (L) of the trench such that ratios H/W>=1.5 and H/L>=1.5. This ratio (e.g., aspect ratio trapping or "ART") may give a minimum H/W ratio limit to block many defects within a buffer layer formed within the trench. Thus, the processes described herein may avoid crystalline defects in the fins due to lattice mismatch in the layer interfaces. For example, defects (e.g., crystalline defects) in the trench may not have extended into or not exist in the epitaxy regions (e.g., the upper device material of the regions). Thus, the fins formed from that material may provide electronic device material (e.g., wells and/or channels) in which defect free fin based devices may be formed.

In some cases, in order to provide high mobility channels on Si, Fin field effect transistor (FET) well and channel materials or layers may be grown using high mobility material grown in an ART trench. In this case, in order to control electrostatics, sub-channel fin (e.g., sub-fin) material may have to be highly doped or have a large enough conduction band or valence band offset to isolate channel material from sub-channel of "sub-fin material." It is also noted that this approach may allow CMOS integration, however may require very deep narrow trench to accommodate all the fin buffer and device layers to be grown within the trench (e.g., see ART noted above). Using this approach, defects can be trapped in a fin at the bottom of deep trenches and leave the top or channel fin area relatively defect free. One problem is that the fin material or area below the channel can still be leaky due to defects (e.g., which cause electron or hole current carrier leakage paths) in the fin, such as defects in the fin in the ART trench or at the bottom of the trench.

Consequently, some embodiments described herein include growing high mobility channels on Si using high mobility material grown in an ART trench, and then etching away or out a sub-buffer layer of the fin to avoid or eliminate leakage due to defects in the fin in the ART trench. According to embodiments, it is possible to grow high mobility fin material in an ART trench, and then form that material into a nanowire (or nano-ribbon) which can be used as a high mobility channel for a transistor (e.g., single material or stack to be a channel of a MOS device). In some cases, the nanowire may be used to form or as part of a "quad-gate" device, such as a device where the nanowire is a "quad-channel" of one or more layers of semiconductor channel material(s). This may be accomplished by removing a portion of the fin below the channel material. In some cases, in the formation of such nanowires or ribbons, it is possible to remove the defective fin material or area under the channel. Such removal isolates the fin channel, removes the fin defects and leakage paths, and forms the nanowire or ribbon of channel material.

According to embodiments, a high mobility fin channel material of type III-V or Ge material is grown on Si via aspect ratio trapping in a deep trench. Because of lattice mismatch, the sub-channel part of the Fin will be defective.

According to some embodiments, with known etch selectivities (e.g., that over a period of time a selected chemical etches away a desired thickness of one selected type of material but not that thickness of another selected material (e.g., only between 2 and 5 percent of that thickness for the other material)), the sub-channel material of the fin (e.g., "sub-fin material" below the channel material) can be a type III-V or Ge material different than the channel or the channel can be protected so that the defective material can be removed by the know etch selective.

According to embodiments, removing the sub-channel material of the fin (1) eliminates parasitic leakage paths in the sub-channel material that effect movement of carriers in the channel; (2) isolates the transistor channel from the STI and material in the trench; and (3) enables the gate to be formed around or on all sides of the channel for superior electrostatic control of the channel. Junction regions (e.g., source and drain) may be formed at the ends of the fin prior to the removal or etch, so that the nanowire is suspended over the opening formed where the sub-fin material was removed. For example, the junction regions can be formed by protecting or covering a portion of the length at the ends of the fin from the etch with a photo resist, while allowing a "gate" etch to etch a center portion of the fin (e.g., a portion between the end portions where the junction regions will be formed). This will remove the sub-channel material and forming the nanowire suspended over the opening formed in the center portion, between the junction regions, below the channel material.

In some cases, by using known etch selectivities (1) the sub-channel material of the fin (e.g., material below the channel material) can be selected or predetermined during formation of the fin, to be a type III-V or IV material that is different than the channel material so that the (e.g., defective) sub-channel material can be selectively etched away without etching (e.g., while leaving) the channel material (e.g., thus forming a nanowire from the remaining channel material). Here, the etchant can be selected to be one that etches the sub-channel material but does not etch the channel material.

In other cases, by using known etch selectivities, (2) the channel material of the fin can be protected during formation of the fin by selected or predetermined thin film layers of another type III-V or IV material different than the channel material (e.g., attached to the top and bottom surface of the channel material) so that the (e.g., defective) sub-channel material can be selectively etched away without etching (e.g., while leaving) the channel material, such as because the channel material is protected from being etched away by the thin film layers and the capillary effect. Here, the etchant can be selected to be one that etches the channel material but does not etch the thin film layers or channel material (e.g., thus forming a nanowire such as a stack or nano-ribbon of the three materials that are the remaining the thin film layers and channel material). For instance, due to the thin height of the channel material and protective thin film on its top and bottom surface; and the capillary effect prohibits or reduces to irrelevant for channel width, the amount of channel material etched.

For example, according to some embodiments, a high mobility channel material is sandwiched (e.g., disposed or located) between two thin, wide band-gap material layers so that a combination of etch selectivity and capillary etch effect can protect the channel material while removing all other material around the between two thin, wide band-gap material layers and channel material. This may include removing sub-channel material but retaining (e.g., not removing) the two thin layers, thus forming a nanowire from the remaining the thin film layers and channel material.

According to embodiments, the "nanowire" formed be only the nanowire from the remaining channel material, or may be the "stack" that is only the channel material, and the two thin film layers. In some cases, removing the sub-channel material is followed by growth of device layers, such as growth of gate layers around all 4 exposed surfaces of the nanowire (or stack) to form a "quad-gate" device (e.g., a device having a channel (e.g., a quad-channel) with two side, a top and a bottom surfaces completely exposed for at least a portion of or their entire length). Transistor devices can then be formed on the sidewalls, bottom and top surface of the nanowire (or stack).

The etch of the defective sub-channel (e.g., sub-fin) material leads to or provides the unexpected benefit of drastically lower transistor leakage when using the nanowire as a transistor channel (e.g., due to not having leakage through the sub-fin material) due to removal of the leakage from the sub-channel or sub-fin material to the substrate. In addition, retaining the thin layers of wide band gap material (e.g., gate dielectric) around the high mobility channel material of the nanowire has been shown to provide the unexpected benefit of superior gate interface properties (e.g., with gate material formed on or around the nanowire) leading to higher carrier mobility. These embodiments can result in the unexpected benefit of: (1) lower off-state leakage transistors due to physical removal of leakage paths in defective sub-channel epitaxial material underneath the channel, (2) higher quality channel material oxide-epitaxial interface with stronger gate control due to the physically thin but wider band gap semiconductor protecting the high mobility channel (3) higher mobility in the channel due to the presence of the wide band gap material protecting the channel, (4) transistors with better on-state current due to the aforementioned improved mobility and improved gate interface quality.

Figure 3C:
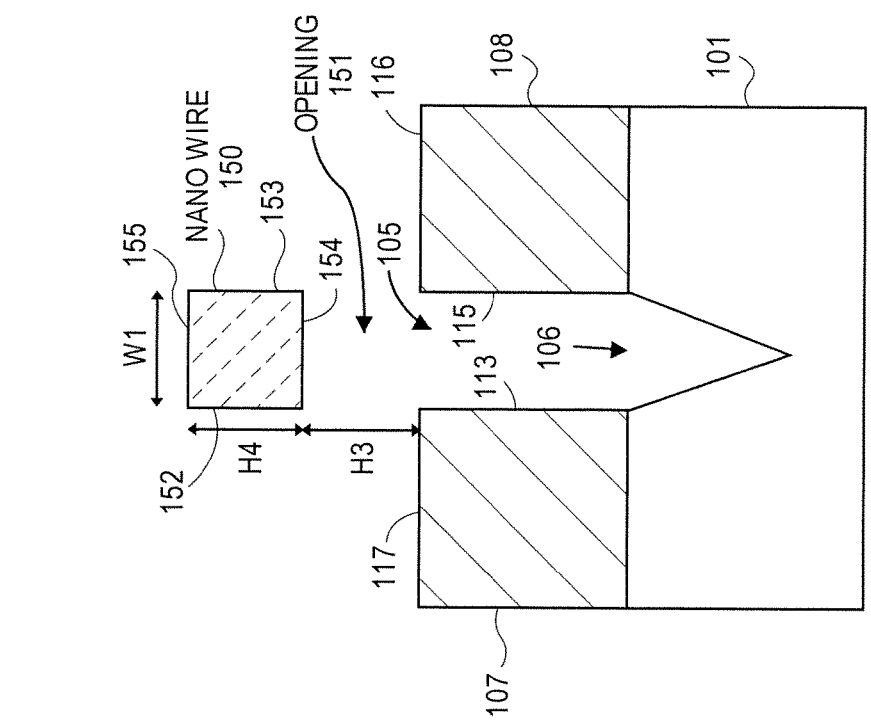
FIG. 3C shows the semiconductor substrate of FIG. 3B after etching to remove a sacrificial sub-fin material to form an electronic device nanowire from a height of a channel layer of channel material extending above etched top surfaces of the STI regions.
Figure 4A:
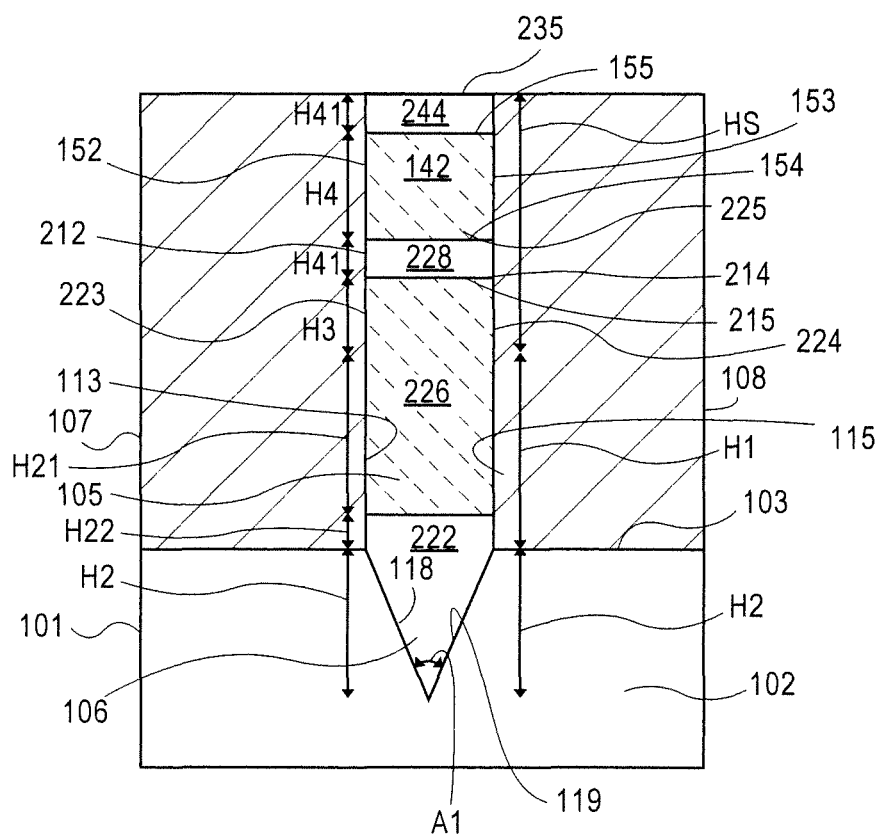
FIG. 4A shows another embodiment of the semiconductor substrate of FIG. 2 after forming epitaxial material in the upper and lower trenches.
Figure 4C:
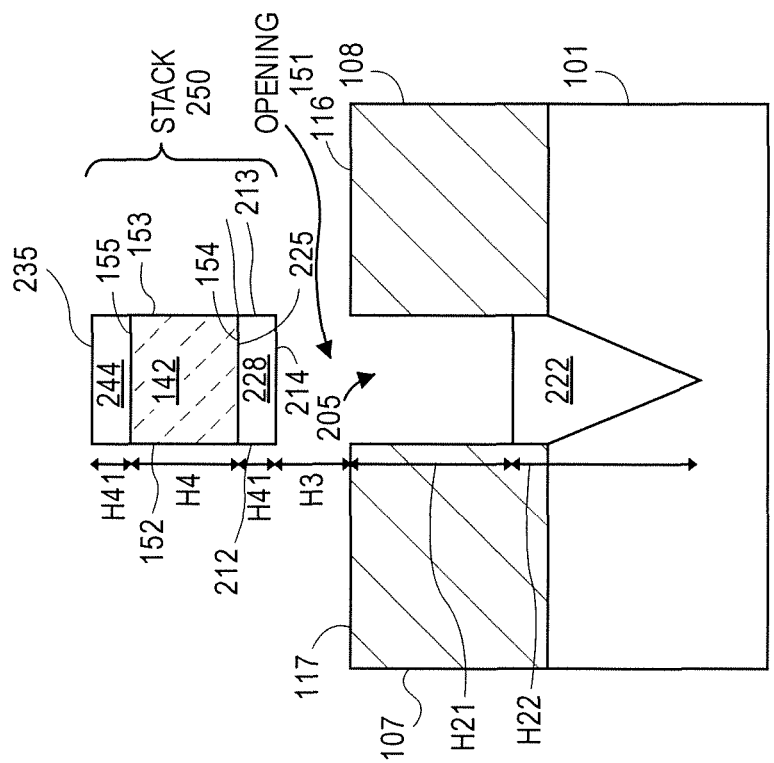
FIG. 4C shows the semiconductor substrate of FIG. 4B after etching to remove a sacrificial sub-fin material to form an electronic device stack from height of the stack of channel material extending above etched top surfaces of the STI regions.

We will now describe forming such nanowires of remaining channel material (e.g., see FIGS. 3C and 4D), or as a remaining "stack" that is channel material between two thin film channel layers (e.g., see FIG. 4C).

FIG. 1 is a schematic cross section view of a portion of a semiconductor substrate base having fin 109 after forming a layer of shallow trench isolation (STI) material on a top surface of the substrate and around the fin. FIG. 1 shows semiconductor substrate or base 101 of material 102 having top surface 103 and having fin 109. Substrate 101 may include, be formed from, deposited with, or grown from silicon, polycrystalline silicon, single crystal silicon, or various other suitable technologies for forming a silicon base or substrate, such as a silicon wafer. For example, according to embodiments, substrate 101 may be formed by growing a single crystal silicon substrate base material having a thickness of between 100 Angstroms and 1000 Angstroms of pure silicon. Alternately, substrate 101 may be formed by sufficient chemical vapor deposition (CVD) of various appropriate silicon or silicon alloy materials 102 to form a layer of material having a thickness between one and three micrometers in thickness, such as by CVD to form a thickness of two micrometers in thickness. It is also considered that substrate 101 may be a relaxed, non-relaxed, graded, and/or non-graded silicon alloy material 102. Material 102 may be a relaxed material (e.g., have a non-strained lattice) at surface 103. Material 102 may be a single crystal silicon material. Substrate 102 may be made of silicon and have top surface 103 (and top surface of fin 109) with a (100) crystal oriented material (e.g., according to Miller Index). In some cases, substrate 101 may be a "miscut" substrate.

In some cases, substrate 101 may be etched to form one or more of silicon fin 109 along the length (e.g., into the page) of the substrate. Fins 109 may be formed by masking the top surface of the substrate above where the fins are to be formed, and etching the material of substrate 101 for a period of time required to form a desired fin height (e.g., height H1 plus H5). Such etching may be performed as known in the art. After forming the fins 109 of material 102 of the substrate, STI material 104 may be deposited in the gaps between the fins, and over the fins. The deposited STI material may then be polished to expose the top of fins 109, such as by chemical, mechanical polishing (CMP) as known in the art. After the polishing, the STI material is formed into separate STI regions 107 and 108 of STI material 104.

STI material 104 may be formed of an oxide or a nitride or combination thereof. STI material 104 may be formed of SiN, $SiO_2$ or another material as know in the art. STI material 104 may be formed by atomic layer deposition (ALD) or chemical vapor deposition (CVD). STI material 104 is generally deposited via Plasma Enhanced Chemical Deposition (PECVD). In some cases, any of various oxygen precursors, Silane precursors, or generic precursors can be used during a process (e.g., PECVD) to form STI material 104, as know in the art. In some cases, STI material 104 may be formed by a process using TEOS+O2+RF at 400° C. In some cases, material 104 may be an amorphous material or non-crystal material.

Figure 2:
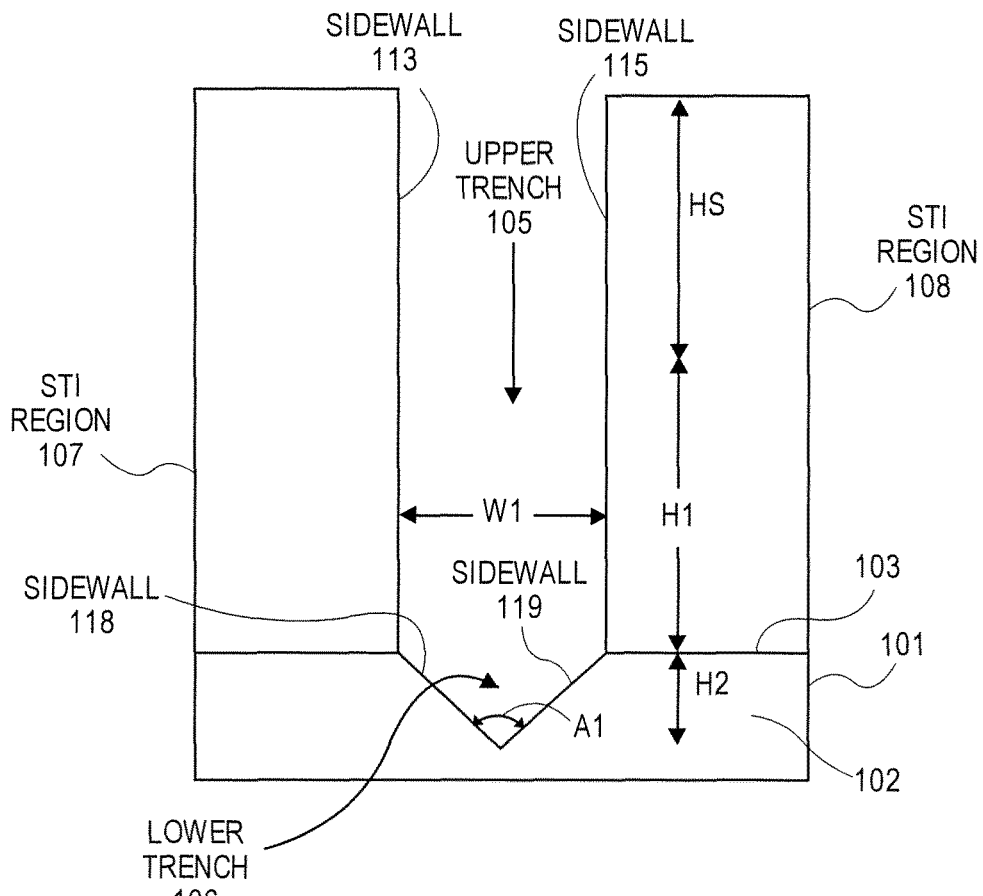
FIG. 2 shows the semiconductor substrate of FIG. 1 after forming an upper and lower trench between the STI regions.

FIG. 2 shows the semiconductor substrate of FIG. 1 after forming an upper and lower trench between the STI regions. FIG. 2 shows upper trench 105 defined between STI regions 107 and 108 and above height of surface 103. Trench 105 may be formed by patterning and etching fin 109 as known in the art. This may include performing a dry etch to remove a height of fin 109 between the STI regions, as known in the art. The etch may or may not use a mask to protect the STI regions. The removed height of fin 109 may extend down to, but not below the top surface 103 of the substrate.

After forming upper trench 104, lower trench 106 may be formed by etching to remove any remaining material of fin 109 and additional material of substrate 101 below surface 103 to form the triangle or "V" shape having angle A1 at its bottom. Forming lower trench 106 may include a subsequently, wet etch such as a trimethol ammonium hydroxide etch to remove any remaining material of fin 109 and height H2 of material 102 below surface 103 of substrate 101. However in some embodiments, the dry etch or wet etch may stop at surface 103 to provide a flat surface of crystalline material, such as material having a (100) crystalline index, instead of the "V" shaped portion of lower trench 106.

STI region 107 has sidewall 113 and height H1 plus H5. STI region 108 has sidewall 115 and height H1+H5. Sidewalls 113 and 115 may be vertical planar surfaces perpendicular to (e.g., at a right angle with respect to) horizontal planar surfaces surface 103. The sidewalls may comprise or be STI material 104. In some cases, the sidewall material may be an amorphous material or non-crystal material. The STI regions 107 and 108 may have a width of at between 10 and 100 nano-meters (nm).

Upper trench 105 may be defined by the sidewalls of regions 107 and 108. More specifically FIG. 2 shows trench 105 defined by or having a side at sidewall 113 of region 107, a side at sidewall 115 of region 108, a bottom at the height of top surface 103, and a top adjacent (e.g., proximate) to top surfaces having height H1 plus H5. Trench 105 may extend to where surface 103 of material 102 would be exposed at the bottom of the trench, prior to etching of material 102 to form lower trench 106. In some cases, each of trench 105 is defined by additional sidewalls of other STI regions, such as a front and back STI having sidewall similar to sidewalls 113 and 115, and top surfaces having height H1 plus H5, but defining length L of trench 105.

Trench 105 may have width W1 defined by the horizontal distance between sidewall 113 of region 107 and side at sidewall 115 of region 108. Width W1 may be a width of between 10 and 100 nanometers (nm). In some cases, W1 is approximately 25 nm. In some cases, width W1 may be 5, 10, 20, or 30 nanometers. In some cases, width W1 may be between 5 and 30 nanometers.

Trench 105 may have height H1 plus H5 defined by the vertical distance between top surface 103 and a top surface of regions 107 and 108. Height H1 may be a height of between 30 and 300 nanometers (nm). In some cases H1 is approximately 75 nm. H1 of the trench may be larger than the W1 of the trench such that ratio H1/W1 is >=1.5. In some cases, the ratio H1/W1 is =1.5. In some cases, the ratio H1/W1 is >=2.0.

In some cases, height HS may be equal to the height H3+H4+H5 as shown and described for FIGS. 3A-D. In some cases, height HS may be equal to the height H3+2× H41+H4 as shown and described for FIG. 4A-D.

Trench 105 may have a length L1 defined as the length going into the page and along sidewall 113 or sidewall 115. Length L1 may be a length of between 50 nm and 5 microns. In some cases, L1 is approximately 500 nm. In some cases, length L1 may be between 200 and 1000 nanometers.

H1 of the trench may be larger than the L1 of the trench such that ratio H1/L1 is >=1.5. In some cases, the ratio H1/L1 is =1.5. In some cases, the ratio H1/L1 is >=2.0. According to some embodiments, W1 may be between 10 and 15 nanometers (nm) and H1 may be 350 nanometers (nm). Optionally L1 may be equal to W1.

FIG. 2 also shows lower trench 106 defined for extending into surface 103 and substrate 101. Trench 106 may be defined between sidewalls 118 and 119 of material 102 of substrate 101. Surfaces 118 and 119 may be substrate inner sidewalls of substrate material 102 having a (111) crystal index substrate material. Sidewalls 118 and 119 may meet at the bottom of trench 106 and form an inward angle of approximately 125 degrees, as known for walls of (111) crystal index formed below a (100) crystal index substrate material top surface 103. Lower trench 106 has height H2 width W1 at its upper opening and length L1. Height H2 may be proportional to width W1 based on forming sidewalls 118 and 119 of (111) crystal index, as known in the art.

Sidewalls 118 and 119 may meet at a bottom of the lower trench and form an inward "V" shaped bottom angle A1 of between 123 and 128 degrees. Angle A1 may be an angle formed at the meeting of sidewalls 118 and 119 of (111) crystal index, as known in the art.

In some cases, sidewalls 118 and 119 are formed by patterning and etching, as known in the art. This may include patterning and etching material 102 using the same etch process used to form trench 106. In some cases this may include using a second etch or a different etch chemistry after forming upper trench 105.

In some cases trench 106 is defined by additional sidewalls of the substrate, such as a front and back sidewall surface of material 102 that may be vertical (e.g., having 110 crystal orientation) or have a (111) crystal orientation. These additional sidewalls may define length L of trench 106. FIG. 2 shows trenches 105 and 106 defined between STI regions 107 and 108 and in surface 103. However it is contemplated that more, similar trenches and regions may exist on substrate 101 (e.g., such as at least hundreds or hundreds of thousands).

Figure 3A:
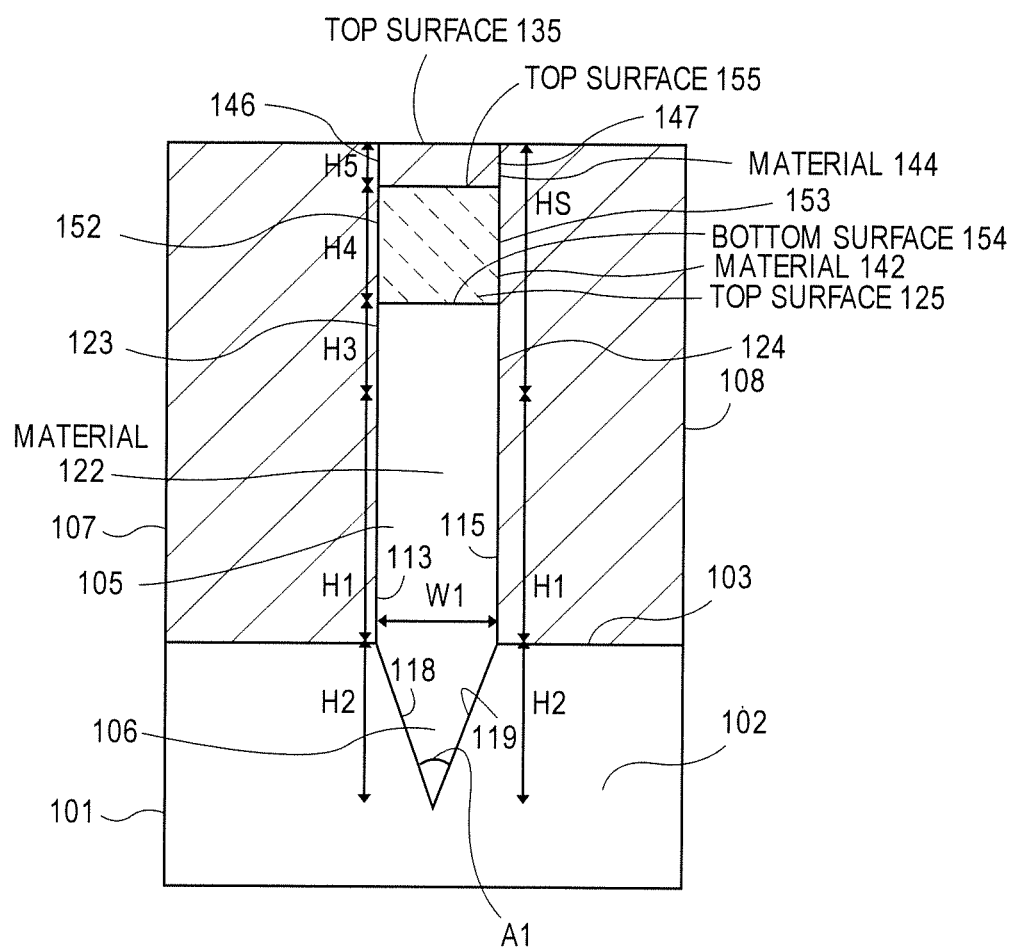
FIG. 3A shows the semiconductor substrate of FIG. 2 after forming epitaxial material in the upper and lower trenches.

FIG. 3A shows the semiconductor substrate of FIG. 2 after forming epitaxial material in the upper and lower trenches. FIG. 3A shows first buffer layer of material 122 epitaxially grown from sidewalls (e.g., side surfaces) 118 and 119 in trench 106. Material 122 may be a buffer layer of a "sacrificial" layer or material that will be subsequently removed or etched to form a nanowire of channel material (s). In some cases, material 122 is a sub-fin buffer layer of fin sacrificial material. Material 122 may be epitaxially grown from (e.g., touching) the (111) crystal surfaces of substrate material 102. Material 122 may be formed by epitaxial growth (e.g., heteroepitaxy growth) using atomic layer epitaxy (ALE), chemical vapor deposition (CVD), Metal-Organic Chemical Vapor Deposition (MOCVD) or Metal-Organic Vapor phase epitaxy (MOVPE), and may only grow from "seed" surfaces 118 and 119 in the trench, but not grow from the STI sidewalls or STI top surfaces. In some cases, material 122 may be formed by epitaxial growth (e.g., heteroepitaxy) using molecular beam epitaxy (MBE), or migration enhanced epitaxy (MEE). Choice of growth deposition like growth temperature, pressure of gas flux, etc may define the selectivity of the epitaxial growth. In some cases, the growth of material 122 is grown selectively from surfaces 118 and 119 by choosing or using a predetermined growth temperature range, pressure of gas flux range, etc., as known for material 122 to grow from material of surfaces 118 and 119, but not grow from or initiate on material of the STI sidewall or top surfaces. Material 122 is also shown having vertical side surfaces.

Material 122 that has height H3 above Height H1. Material 122 may have bottom surfaces having a (111) crystal oriented material grown from surfaces 118 and 119, and side surfaces having a (110) crystal oriented material along or adjacent to sidewalls 113 and 115. Material 122 may have side surfaces 123 and 124 extending height H3 above Height H1 having a (110) crystal oriented material and parallel to sidewalls 113 and 115. In some embodiments, crystalline defects may exist in material 122 near or along the sidewalls 113 and 115 of the STI forming the trenches. In some embodiments, crystalline defects may exist in material 122 due to defects, including the Stacking faults that originate at the STI sidewalls 113 or 115, that still remain within height H1 upper trench 105. In some cases, these defects may discontinue at or not exist above height H1, and thus may not exist within height H3.

In some cases, height H3 may be between 50 and 60 nanometers. In some cases, height H3 may be a height of between 10-50 nanometers (nm). In some cases H3 is approximately 10 nm. In some cases, height H3 may be a height of at least 10 nm. In some cases H3 is between 20 and 100 nm. In some cases H3 is 50 nm. In some cases, height H3 is great enough or sufficient to allow material 122 to be selectively (e.g., with respect to material 142) horizontally etched to remove height H3 or all of material 122 to form a nanowire of material 142 having height H4 and sidewalls 152 and 154.

Material 122 may have top surface 125 having a (100) crystal orientation (Miller Index). The top surface of material 122 form a flat surface having a (100) crystal index. Material 122 may have width W1 between sidewalls 113 and 115. Material 122 may have a length L1.

In some cases, junction regions (e.g., source and drain) are formed at the ends of material 122 prior to removal of material 122, so that when material 122 is removed or etched (e.g., as noted for FIGS. 3B-C and 5), the remaining nanowire or ribbon (e.g., of material 142) is suspended over the opening formed where sub-fin material 122 was removed. Side surfaces 123 and 124 may be etched to remove width W1 of height H3; or all of material 122 to form such a nanowire of material 142.

The crystal lattice of material 122 may be a different size than (e.g., a lattice mismatch with) the crystal lattice of material 102. Thus, material 102 may induce a strain in material 122. This strain may be caused by the lattice mismatch with material 102 at sidewalls 118 and 119. This strain may be bidirectional strain due to the angel of sidewalls 118 and 119. The strain in material 122 may be a strain caused by the lattice mismatch as known in the art. In some cases, because it is a buffer layer and it is thick, material 122 will be relaxed and defective. In some cases, the critical thickness above which the material will relax may be a thickness of less than 6 nm, so there will be no strain in material 122 above Height H1. Material 122 may be a relaxed material (e.g., have a non-strained lattice) at height H3 and at surface 125.

FIG. 3A shows material 122 having top surface 125 upon which or from which a channel layer of channel material 142 is epitaxially grown. Material 142 of FIG. 3A may be a channel material for a transistor (e.g., single material or part of a stack of channel materials to be a channel of a MOS device). Material 142 has bottom surface 154, such as a surface atomically bonded to or epitaxially grown from (e.g., touching) surface 125. Material 142 also includes top surface 155, from which a buffer layer of buffer material 144 is epitaxially grown. Material 142 is also shown having vertical side surfaces 152 and 153. These surfaces may be continuations of side surfaces of material 122. According to some embodiments, material 142 may be formed by epitaxial growth (e.g., heteroepitaxy growth) using atomic layer epitaxy (ALE), chemical vapor deposition (CVD), Metal-Organic Chemical Vapor Deposition (MOCVD) or Metal-Organic vapor phase epitaxy (MOVPE), and may only grow from "seed" top surface 125 of material 122. In some cases, material 142 may be formed by epitaxial growth (e.g., heteroepitaxy) using molecular beam epitaxy (MBE), or migration enhanced epitaxy (MEE) and may only grow from "seed" top surfaces 125. Material 142 may be an epitaxially grown defect free, single crystal material, grown from a single crystal defect free surface 125 of material 122.

Material 142 that has height H4 above surface 125. Material 142 may have bottom surface 154 having a (100) crystal oriented material grown from surface 125, and vertical side surfaces 152 and 153 having a (110) crystal oriented material. Side surfaces 152 and 153 may be continuations of (e.g., extend parallel from or above) side surfaces 123 and 124 of material 142, such as by both side surfaces being grown in trench 105. In some embodiments, crystalline defects may not exist in material 142 due to the use of buffer layer 122. In some cases, the defects in layer 122 discontinue at or not exist within height H3 and thus are not continued or carried into material 122.

In some cases, height H4 may be between 3 and 20 nanometers. In some cases, H4 is 10 nanometers. In some cases, H4 is 20 nanometers. In some cases H4 is between 15 and 30 nanometers. In some cases, height H4 may be a height of between 2-10 nanometers (nm). Height H4 may be a height of less than 20 nm. Height H4 may be a height of less than 10 nm. In some cases H4 is between 2 and 5 nm.

In some cases, height H3 is great enough or sufficient to allow exposed sidewalls material 122 having height H3 to be selectively (e.g., with respect to material 142) horizontally etched (e.g., as noted for FIGS. 3B-C and 5) to remove height H3 or all of material 122 to form nanowire 150 of material 142 having height H4 and sidewalls 152 and 153. This may be due to material 122 being selectively etched to (1) remove the all of material 122, but (2) not remove material 142 due to the etch chemistry etching material 122 at least 50 times, a hundred times, or thousands of times faster than etching material 142 over a period of time.

Material 142 may have top surface 155 having a (100) crystal orientation (Miller Index). In some cases, the top surface of material 142 forms a flat surface having a (100) crystal index. Material 142 may have width W1 between side surfaces 152 and 153. Material 142 may have a length L1.

In some cases, junction regions are formed at the ends of material 142 prior to removal of material 122, so that when material 122 is removed or etched (e.g., as noted for FIGS. 3B-C and 5), the remaining nanowire or ribbon of material 142 is suspended over the opening formed where sub-fin material 122 was removed. Side surfaces 123 and 124 may be etched to remove height H3 or all of material 122 to form such a nanowire 150 of material 142 having height H4 and sidewalls 152 and 154.

Figure 3B:
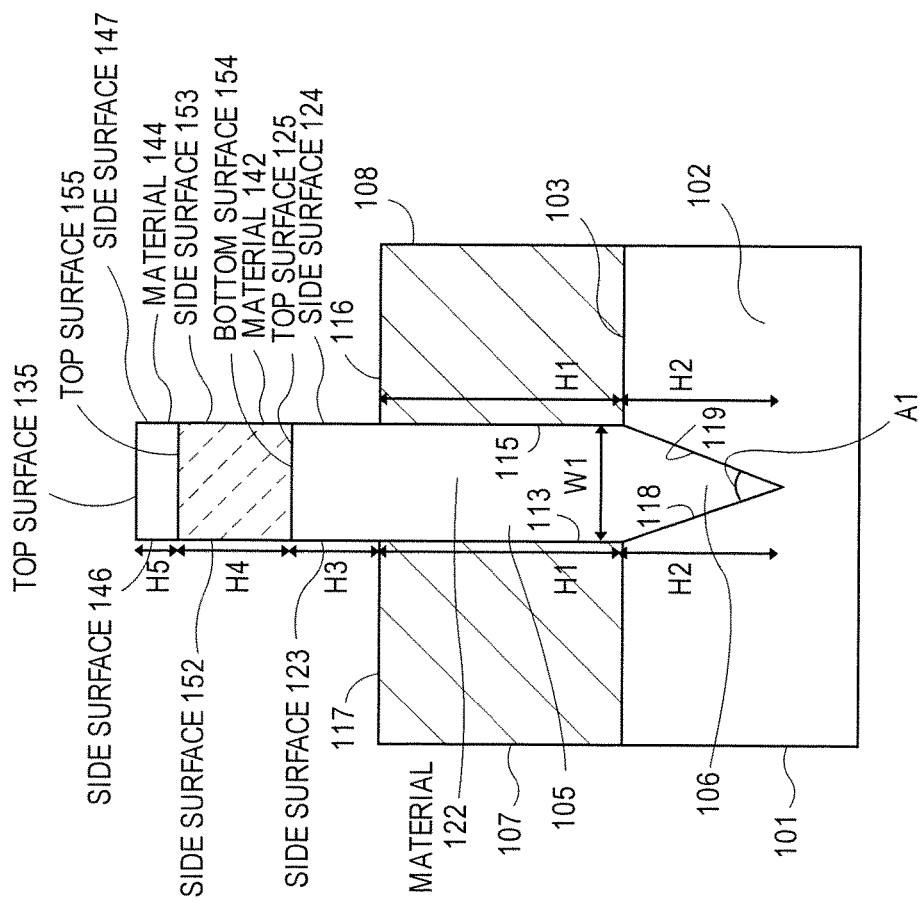
FIG. 3B shows the semiconductor substrate of FIG. 3A after etching STI regions to remove a height of them and to expose a height of the sacrificial sub-fin material that can be etched.
Figure 3D:
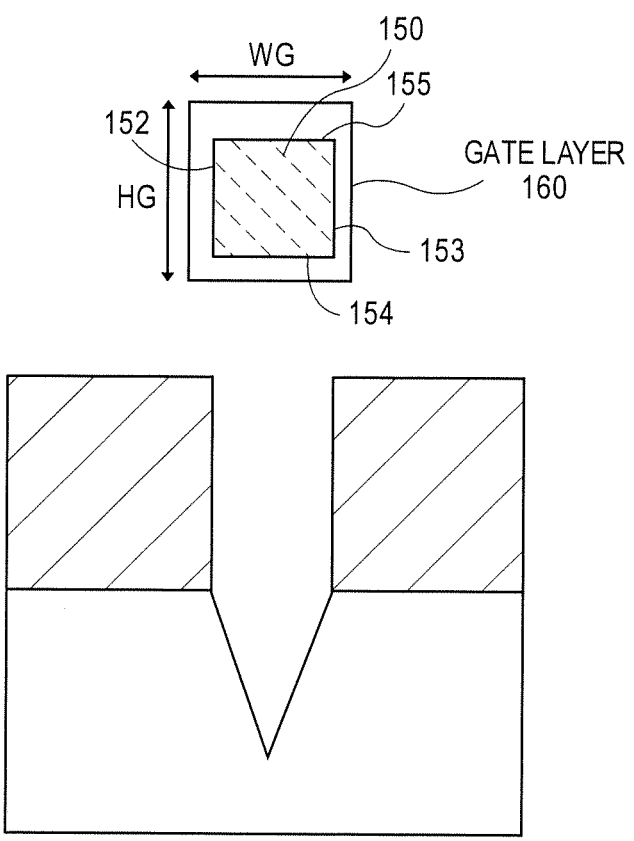
FIG. 3D shows the semiconductor substrate of FIG. 3C after forming a first conformal thickness of a first conformal epitaxial "cladding" material grown from all 4 exposed surfaces of the electronic device nanowire.

For example, the junctions regions can be formed by protecting a length at the ends of the fin of FIG. 3A or B with a photo resist, to protect the end portions of material 122 and 142 from the etch, while allowing a "gate" etch of FIG. 3D to etch a center portion of the fin (e.g., a portion between the end portions where the junction regions will be formed) thus removing the sub channel material 122 and forming the nanowire 150 suspended over the opening formed in the center portion, between the junction regions, below the channel material.

The crystal lattice of material 142 may be a different size than (e.g., a lattice mismatch with) the crystal lattice of material 122. Thus, material 122 may induce a strain in material 142. This strain may be unidirectional and/or bidirectional due to the crystal lattice mismatch between surface 125 and 154. The strain in material 142 may be a strain caused by the lattice mismatch as known in the art. Due to forming the junction regions, this strain may continue to exist, or remain in the channel layer of material 142, after material 122 (and optionally 144) is etched away. Carrier mobility of holes or electron carriers may be increased due to the compressive or tensile strain in material 142, respectively. In some cases, Material 142 can be strained with respect to material 122 and the strain is bidirectional (e.g., due to crystal lattice mismatch at surfaces 125 and 154). In some cases, because the fins are long in length L1 but short in width W1, the narrow direction of this strain is small because the strain can relax in the width direction for narrow fins and thus this strain converts to a unidirectional strain along the length L1 of the fin.

Material 142 may be a relaxed material (e.g., have a non-strained lattice) with respect to its interface with the lattice of material 122 at surface 125 and 154. In some cases, material 142 is a strained layer (unidirectionally and/or bidirectionally depending on fin width) with respect to the substrate (e.g., material 102; or sidewalls 118 and 119).

In some cases, based on width W1, material 142 may be bidirectionally strained due to a long width W1. Bidirectional strain may provide increased carrier mobility as compared to unidirectional strain. Thus, providing width W1 short enough to result in unidirectional strength may result in unexpected effects of a smaller transistor or nanowire 150, while sacrificing some carrier mobility. In some cases, the lattice of material 142 may match that of material 122, thus there will be no strain in material 142 from material 122.

In some cases material 142 may have height H4 that is small enough (e.g., less than 6 nanometers) that there is a strain in material 142 at top surface 155. In other cases, H4 may be great enough that while strain exists in the lower part of height H4, no strain remains in material 142 at top surface 155.

FIG. 3A shows material 142 having top surface 155 upon which or from which a buffer layer of buffer material 144 is epitaxially grown. Material 144 may be a "sacrificial" layer or material that will be subsequently removed or etched, such as when (or after when) material 122 is etched. Material 144 is optional and may be excluded in certain embodiments. Material 144 has a bottom surface, such as a surface atomically bonded to or epitaxially grown from (e.g., touching) surface 155. Material 144 also includes top surface 135. According to some embodiments, material 144 may be formed by epitaxial growth as noted above for forming material 142, and may only grow from "seed" top surface 155 of material 142. Material 144 may be an epitaxially grown defect free, single crystal material, grown from a single crystal defect free surface 155 of material 142.

Material 144 that has height HS above surface 155. Material 144 may have a bottom surface having a (100) crystal oriented material grown from surface 155, and side surfaces 146 and 147 having a (110) crystal oriented material. Side surfaces 146 and 147 may be continuations of (e.g., extend parallel from or above) side surfaces 152 and 154 of material 142, such as by both side surfaces being grown in trench 105. In some embodiments, crystalline defects may not exist in material 144 due to the use of buffer layer 122. In some cases, the defects in layer 122 discontinue at or not exist within height H3 and thus are not continued or carried into material 142 or 144.

Height H5 may be a height of between 1-10 nanometers (nm). In some cases H5 is approximately 5 nm. Height HS may be a height of less than 5 nm. In some cases HS is between 2 and 5 nm. In some cases HS is 2 nm.

Material 144 may have top surface 155 having a (100) crystal orientation (Miller Index). The top surface of material 144 may be polished or etched to form a flat surface having a (100) crystal index. Material 144 may have width W1 between side surfaces. Material 144 may have a length L1.

In some cases, junction regions (e.g., source and drain) are formed at the ends of material 144 prior to removal of material 144, so that when material 144 is removed or etched (e.g., as noted for FIGS. 3B-C and 5), the remaining nanowire or ribbon (e.g., of material 142) is suspended below where material 144 was removed. Side surfaces 146 and 147 (and optionally, top surface 135, unless masked) may be etched to remove height H5 or all of material 144 to form such a nanowire 150 of material 142.

For example, the junctions regions can be formed by protecting a length at the ends of the fin of FIG. 3A or B with a photo resist, to protect the end portions of layers 122, 142 and 144 from the etch, while allowing a "gate" etch of FIG. 3D to etch a center portion of the fin (e.g., a portion between the end portions where the junction regions will be formed) thus removing the sub channel material 122 and forming the nanowire 150 suspended over the opening formed in the center portion, between the junction regions, below the channel material.

The crystal lattice of material 144 may be a different size than (e.g., a lattice mismatch with) the crystal lattice of material 142. Thus, material 144 may induce a strain in material 142. This strain may be unidirectional due to surface 155. The strain in material 142 may be a strain caused by the lattice mismatch as known in the art. In some cases, material 142 can be strained with respect to material 144 and the strain is bidirectional (e.g., due to crystal lattice mismatch at surface 154). In some cases, because the fins are long in length L1 but short in width W1, the narrow direction of this strain is small because the strain can relax in the width direction for narrow fins and thus this strain converts to a unidirectional strain along the length L1 of the fin. In some cases, because of H5 being thin, material 142 is not strained with respect to material 144 because there is not enough thickness in H5 for material 144 to cause a strain in material 142.

Material 144 may be a relaxed material (e.g., have a non-strained lattice) with respect to its interface with the lattice of material 142 at surface 155. In some cases, material 144 is a strained layer (unidirectionally and/or bidirectionally depending on fin width) with respect to the substrate (e.g., material 102).

In some cases, forming material 144 includes forming a height of material 144 above the top surfaces of STI regions 107 and 108, and then polishing material 144 and the top of the STI regions to form the structure shown in FIG. 3A. One benefit of forming layer 144 is that when layer 144 is subsequently polished (e.g., by CMP) any damage to the crystalline structure of layer 144 due to or resulting from the polishing, will not damage layer 142. In other words, if layer 144 did not exist, and instead, layer 142 and the STI regions were polished to form a flat top surface, damage resulting from such polishing would exist in material 142. Instead, by forming layer 144, layer 142 is not damaged by the polish that would be otherwise used to form height H5 of material 142.

In addition, an advantage of forming layer 144 is that it is possible to more accurately grow material 142 to height H4, and subsequently grow material 144 which will be etched so that height H4 of material 142 remains. On the other hand, it is more difficult to accurately polish material 142 to form height H4 than it is to grow material 142 to height H4. In other words, it is easier to control the height that material 142 would be epitaxially grown to (e.g., height H4) than it is to control the height which material 142 would be polished to.

In some cases, surfaces 125, 153, 155 and 135 may all have (100) crystal orientation. Surfaces 152 and 153 may have (110) crystal orientation.

FIG. 3B shows the semiconductor substrate of FIG. 3A after etching STI regions to remove a height of them and to expose a height of the sacrificial sub-fin material that can be etched. FIG. 3B shows the semiconductor substrate of FIG. 3A after etching STI regions 107 and 108 to remove height HS and to expose H3, H4 and H5 of the fin materials. In some embodiments, after FIG. 3A, an "oxide" etch is used to remove height HS of material 104 to form top surfaces 117 of regions 107 and 116 of region 108 of STI material. The top surfaces 116 and 117 are at height H1, and leave side surfaces 123 and 124 of height H3 of material 122 exposed. The etch may expose height H3 of the sacrificial sub-fin material 122 that is a sufficient height that can be etched as noted herein. The etch leaves side surfaces 152 and 153 of height H4 of material 142 exposed. The etch also leaves side surfaces 146 and 147 of heights H5 of material 144 exposed.

In some cases the etch may be a hydrogen fluoride (HF) etch or a hydrogen chloride (HCl) etch as known in the art to remove the STI material or oxide material of height HS of material 104. In some cases the etch may include patterning and etching material 104 to form surfaces 116 and 117 at height H1 using a resist or hard mask to cover all of top surface 135 material 144. In some cases 1, 2, or 3 resist layers may be used for the patterning materials. In some cases, patterning and etching material 104 to form the STI regions includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature. This etch may or may not stop at surfaces 116 and 117 or at height H1.

FIG. 3C shows the semiconductor substrate of FIG. 3B after etching to remove a sacrificial sub-fin material 122 to form an electronic device nanowire from a height of a channel layer of channel material extending above etched top surfaces of the STI regions. FIG. 3C shows the semiconductor substrate of FIG. 3B after etching to remove material 122 (and optionally 144, when material 144 exists) to form an electronic device nanowire 150 from height H4 (width W1 and length L1) of the channel layer (e.g., material 142) extending above etched top surfaces of the STI regions.

According to embodiments, material 122 may be selectively etched with respect to material 142 by using an etch chemistry that is selected or known to etch material 122 without etching material 142. Etching to remove Height H3 or all of material 122 (and optionally all of 144, when material 144 exists) may be etched by wet or dry etching. In some cases, such etching by use a wet etch (e.g., of HF) or a dry etch chemistry.

In some cases, the etch may be an isotropic wet etch that with an etch chemistry selected to etch (remove) at least thickness W1 of height H3 or a portion of height H3 of material 122, but the chemistry does not remove material 142. In some cases, the etch may be a subtractive etch, such as to etch away material 122, with the exception of other materials, such as material 142. In some cases, the etch may use Chlorine or another acidic dry etch chemistry. In some cases, material 122 is selectively etched using a wet etch (e.g., of HF) or a dry etch to remove all of material 122.

The etch may use a selected wet etch chemistry (etchant) and etch time for the removal. The chemistry may be a HCl wet isotropic etch to remove InP but not smaller lattice InGaAs (e.g., where material 122 is InP and 142 is AnGaAs which is tensile strained by larger lattice InP for an NMOS device). In some cases, the chemistry may be a citric wet isotropic etch to remove InGaAs but not InP. These selective wet etches may be used to form a NMOS device, such as a device where the percentages of different type III/V material are chosen for materials of FIGS. 3A-D to result in a tensile strain along length L1 of nanowire 150 to cause in increase in electron carrier mobility between the junction regions. For instance, material 122 and 144 may be InP, while material 142 is InGaAs.

It is considered that other proper type III/V materials and selective etchants of those materials may be selected based on the percentages of different type III/V material chosen to create the devices of FIGS. 3A-D. These selections may also apply to the processes of FIG. 5.

Alternatively, the chemistry may be an ammonium hydroxide wet isotropic etch to remove silicon but not larger lattice silicon germanium (e.g., where material 122 is Si and 142 is SiGe which is compressive strained by smaller lattice Si for a PMOS device). The chemistry may be an ammonium sulfide wet isotropic etch to remove silicon germanium but not larger lattice germanium (e.g., where material 122 is SiGe and 142 is Ge which is compressive strained by smaller lattice SiGe for a PMOS device).

These selected wet etches may be used to form a PMOS device, such as device where the percentages of silicon and germanium are chosen for materials of FIGS. 3A-D to result in a compressive strain along length L1 of nanowire 150 to cause in increase in hole carrier mobility between the junction regions. For instance, the first and second materials may be Si and Ge; Si and SiGe; or SiGe and Ge.

It is considered that other proper type IV material percentages (e.g., of Si and Ge) and selective etchants of those materials may be selected based on the percentages of different type IV material chosen to create the devices of FIGS. 3A-D. These selections may also apply to the processes of FIG. 5.

In some cases material 144 is etched at the same time or during the same etch as that used to selectively etch material 122. In this case, material 144 may be the same material as material 122. In other cases, material 144 is etched at a different time or during a different etch as the etch used to selectively etch material 122. In this case, material 144 may be a different material than material 122.

Such etching may use a "timed" etch, such as an etch for a period of time known to remove height H3 or all of material 122; or may use another process that is know to perform such etching. After the etch, channel layer of material 142 may be or include an "exposed" device well or channel layer extending or disposed height H3 above the etched STI regions 108 and 107.

In some cases, after the etch, nanowire 150 of material 142 has exposed side surfaces 152 and 153 that may be planar surfaces parallel to and aligned with (e.g., directly above) planar sidewalls 113 and 115. Surfaces 152 and 153; bottom surface 154; and top surface 155 of the channel layer of material 142 may be considered "exposed" after etching an before growth of a material from or on these surfaces, such as growth a device gate or gate dielectric layer on all 4 of the exposed surfaces.

Nanowire 150 may be an epitaxially grown channel fin layer or nanowire layer of a first epitaxial material (e.g., to become a P- or N-type material) having surfaces 152, 153, 154 and 155 of material 142. In some cases, Nanowire 150 may be a "device" layer, such as a layer on or in which circuit devices are formed, as known in the art. Thus, nanowire 150 may provide electronic device material (e.g., wells and/or a channel) in which defect free nanowire (e.g., fin or "quad-gate") based devices may be formed. In some cases, nanowire 150 may be a channel layer (e.g., a "quad-channel") or nanowire having 4 exposed sides upon or on which a "device" or gate dielectric or material will be formed, as known in the art. Nanowire 150 may have exposed surfaces 152, 153, 154 and 155 of material 142 of the fin layer of material 142 extending above an etched opening 151, height H3 above top surfaces of STI regions 107 and 108.

Figure 5:
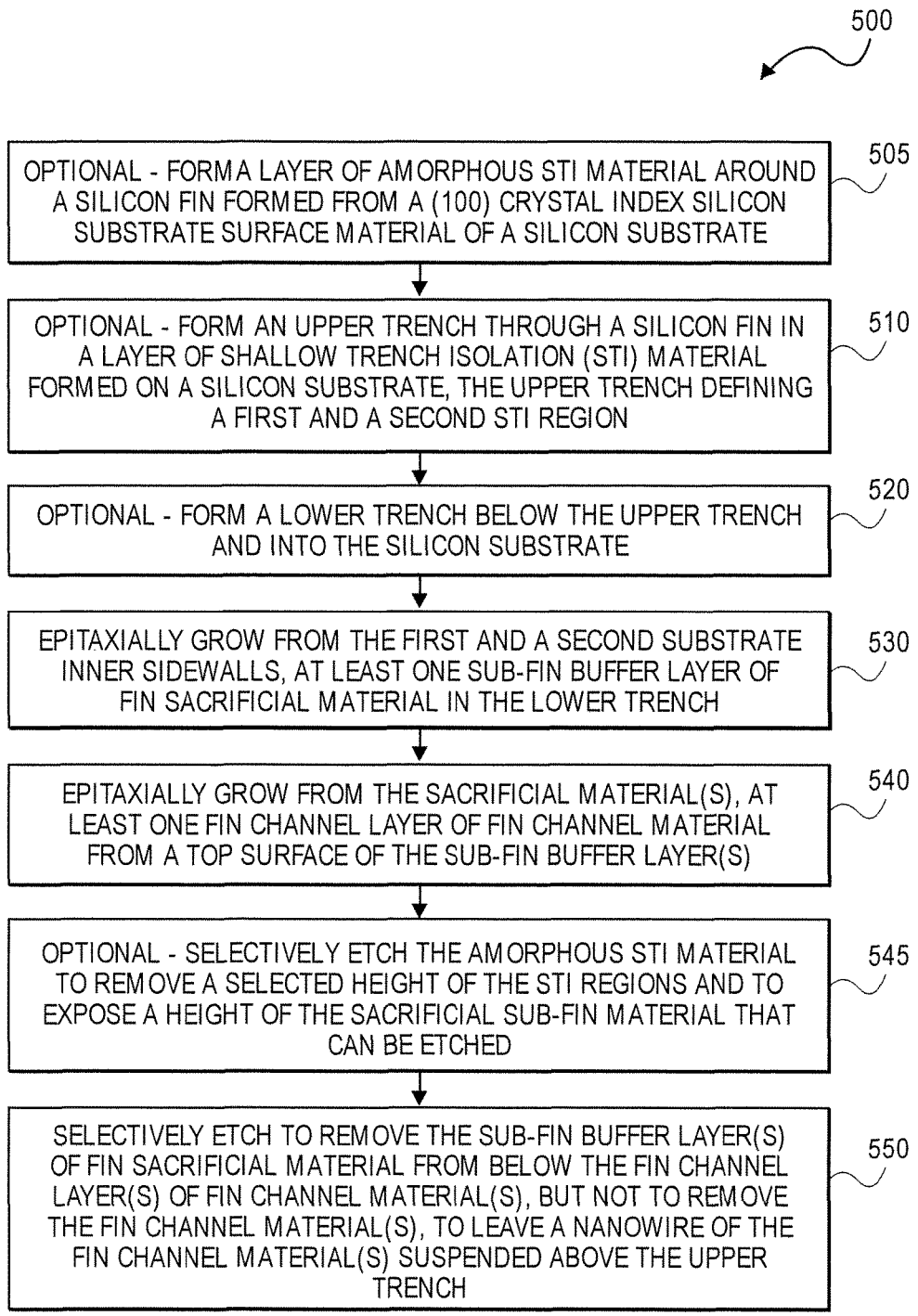
FIG. 5 shows a flow diagram of an example process for forming a high mobility nanowire "quad-gate" device over a substrate by using a sacrificial sub-fin material.

In some cases, junction regions are formed at the ends of nanowire 150 (e.g., prior to removal of material 122) so that the nanowire of material 142 is suspended over the opening formed where sub-fin material 122 was removed (e.g., at least opening 151; and optionally trench 105 and 106, such as noted for FIGS. 3B-C and 5).

The crystal lattice of material 142 of nanowire 150 may be a different size than (e.g., a lattice mismatch with) the crystal lattice of material 122. Thus, material 122 may have induced a strain in material 142 of nanowire 150 that remains or continues to exist after removal or etching of material 122 (and optionally 144). This strain may be a strain as noted herein for material 142. The strain may remain due to the ends of Nanowire 150 being anchored in or bonded to (e.g., between) the junction regions. For example, due to formation of material 142 having ends formed in or on the junctions regions, strain induced into material 142 by material 122 remains even after material 122 is removed because the length of material 142 does not change after removal of material 122. Thus, a compressive or tensile strain in material 142 of nanowire 150 remains. This strain may be unidirectional and/or bidirectional due to the crystal lattice mismatch between surface 125 and 154 when material 142 is grown. In some cases, this strain is unidirectional since material 122 and 144 are removed and the lattice mismatch between those materials and material 142 no longer exists, but the length of material 142 has not changed. The strain in material 142 may be a strain caused by the lattice mismatch as known in the art.

In some cases, nanowire 150 has a bidirectional strain along the length L1 of nanowire 150 with respect to the substrate (e.g., material 102). This may be due to a nanowire 150 width W1 being greater than 6 nm. In some cases, nanowire 150 has a unidirectional strain along the length L1 of nanowire 150 with respect to the substrate (e.g., material 102). This may be due to a nanowire 150 width W1 being less than 6 nm. In some cases, nanowire 150 has no strain along the length L1 of nanowire 150 with respect to the substrate (e.g., material 102). This may be due to a nanowire 150 height H4 being less than 6 nm; and/or no lattice mismatch between material 142 and 122.

FIG. 3D shows the semiconductor substrate of FIG. 3C after forming a first conformal thickness of a first conformal epitaxial "cladding" material grown from all 4 exposed surfaces of the electronic device nanowire. FIG. 3D a first conformal thickness of conformal epitaxial gate or gate dielectric material 160 (e.g., "cladding") grown from or on all 4 exposed surfaces (e.g., side surfaces 152 and 153; bottom surface 154; and top surface 155) of the channel layer of material 142. Material 160 may form a conformal layer with width WG and height HG, which are greater than width W1 and height H4, respectively, by twice the thickness of material 160. The gate dielectric (e.g., material 160) may be a gate dielectric as known in the art. In some cases, it may be titanium silicon oxide, or another oxide dielectric. In some cases, the gate dielectric material is or includes tantalum, SiO, HfO, and/or AlO.

In some cases, gate dielectric 160 may be a dielectric material having thickness of 1-2 nanometers, having a much larger band gap than material 142. In some cases, gate dielectric 160 is formed by atomic layer deposition (ALD) on to all four exposed surfaces of material 142. In some cases dielectric 160 is formed by chemical vapor deposition (CVD) on to all four exposed surfaces of material 142.

In some cases, material 160 does not extend length L1, such as by not extending to junction regions attached to material 142. In some cases, material 160 may have a length of less than L1, such as where material 142 is a device channel material, and material 160 is a gate buffer or dielectric material that does not extend in length to either junction region material formed over a only portion (or two end portions) of length L1 of the channel material 142. If material 160 is a gate buffer material, a gate dielectric or electrode material may be clad from or formed over the gate buffer material.

In this case, the sidewall and top surfaces of material 160 along a length of material 142 (or two lengths) may be masked or patterned during cladding of material 160 onto material 142 so that material 160 is clad along only the desired portion of a total length L1 of the channel material 142. In other cases, material 160 may be etched to form if only on the desired portion of the length L1.

In some cases, material 160 is a gate buffer material that helps prevent defects between channel material 142 and a high K gate dielectric material formed over material 160 (e.g., for a quad-gate device) by having reduced broken bonds at the interface between material 142 and 160 (e.g., where material 160 is grown from material 142).

In some cases, material 160 is a gate buffer material and a high K gate dielectric or electrode material of between 2 and 30 nm in conformal thickness is formed over material 160 (e.g., for a quad-gate device), such as by cladding as described herein or by another process. According to some embodiments, a gate buffer material may be formed above and below material 142, such as described for materials 228 and 244 of FIGS. 4A-C.

Further device layers, such as a gate dielectric can be formed on (or grown from) layer 160. This may include gate electrode and other known electronic device or transistor processing.

A gate electrode may be formed on layer 160 or the gate insulator. In some cases, this may be done by ALD, but not by sputtering. In some cases, the gate electrode is ruthenium (Ru). In some cases, the gate electrode is a metal. In some cases the gate electrode is one of ruthenium, titanium nitride, titanium aluminum, titanium aluminum nitride, and metal deposited by atomic layer deposition, and the like.

FIG. 4A shows another embodiment of the semiconductor substrate of FIG. 2 after forming epitaxial material in the upper and lower trenches. FIG. 4A shows first buffer layer of material 222 epitaxially grown from surfaces 118 and 119 in trench 106. Material 222 may be a buffer layer of a "sacrificial" layer or material that will be subsequently removed or etched. In some cases, material 222 is a sub-fin buffer layer of fin sacrificial material. Material 222 may be epitaxially grown from (e.g., touching) the (111) crystal surfaces of substrate material 102, but not grow from the STI sidewalls or STI top surfaces as described with respect to growing material 122.

Material 222 has height H22 above first surface 103 of substrate 101. In some cases, material 222 is similar to material 122 except that material 222 only has height H22 above surface 103 instead of height H3 above surfaces 117 and 116. Material 222 may have bottom surfaces having a (111) crystal oriented material grown from surfaces 118 and 119, and side surfaces having a (110) crystal oriented material along or adjacent to sidewalls 113 and 115.

In some embodiments, crystalline defects may exist in material 222 near or along the sidewalls 113 and 115 of the STI forming the trenches. In some embodiments, crystalline defects may exist in material 222 due to defects, including the Stacking faults that originate at the STI sidewalls 113 or 115, that still remain within upper trench 105. In some cases, these defects may continue or exist within height H22.

Height H22 may be a height of between 4-20 nanometers (nm). In some cases H22 is approximately 10 nm. Height H22 may be a height of at least 4 nm. In some cases H22 is between 4 and 40 nm. In some cases H22 is 40 nm.

Material 222 may have a top surface having a (100) crystal orientation. In some cases, the top surface of material 222 forms a flat surface having a (100) crystal index. Material 222 may a width and length similar to material 122.

In some cases, material 222 may have junction regions formed at its ends similar to material 122. In some cases, junction regions are formed at the ends of material 142 prior to removal of material 222.

The crystal lattice of material 222 may be a different size than (e.g., a lattice mismatch with) the crystal lattice of material 102. Thus, material 102 may induce a strain in material 222. This strain may be caused by the lattice mismatch with material 102 at sidewalls 118 and 119. This strain may be bidirectional strain due to the angel of sidewalls 118 and 119. The strain in material 222 may be a strain caused by the lattice mismatch as known in the art. In some cases, because it is a buffer layer and it is thick, material 222 will be relaxed and defective. In some cases, the critical thickness above which the material will relax may be a thickness of less than 6 nm, so there will be no strain in material 222 above Height H22. Material 222 may be a relaxed material (e.g., have a non-strained lattice) at height H22.

Material 222 may be a relaxed material (e.g., have a non-strained lattice) with respect to its interface with the lattice of material 102 at sidewalls 118 and 119. In some cases, material 222 is a relaxed layer (partially or fully) with respect to the substrate (e.g., sidewalls 118 and 119).

In some embodiments, material 122 is a "nucleation layer" to provide better nucleation between the silicon material of sidewalls 118 and 119, and a subsequent epitaxial layer (e.g., layer 226, such as where layer 226 is a type III/V material and/or is a material formed of three elements (e.g., instead of 2 elements). Such a case may include where material 222 is indium phosphate or another mixture of two type III/V materials, while material 226 is indium gallium arsenide, or another mixture of three type III/V materials. In this case, layer 22 is selected to have a lattice and thickness that grows more evenly over the silicon material of sidewalls 118 and 119 (e.g., material 102) and provide better nucleation in its growth structure from that material. Then, material 226 may be grown from material 222 with good nucleation and even growth from material 222. On the other hand, directly growing material 226 from materials 118 and 119 may result in uneven growth and less nucleation in material 226 grown at or from surfaces 118 and 119, than if material 122 is grown first.

FIG. 4A shows material 222 having a top surface upon which or from which a second buffer layer of material 226 is epitaxially grown. Material 226 has a bottom surface, such as a surface atomically bonded to or an epitaxially grown from (e.g. touching) the top surface of material 222. Material 226 also includes a top surface 215, from which a buffer layer of buffer material 228 epitaxially grown. Material 226 is shown having height H21 above material 222. Material 226 also has height H3 above height H1.

Material 226 may be a buffer layer of a "sacrificial" layer or material that will be subsequently removed or etched. In some cases, material 226 is a sub-fin buffer layer of fin sacrificial material. Material 226 may be epitaxially grown from (e.g. touching) the (100) crystal surface of material 222.

Material 226 has a bottom surface having a (100) crystal oriented material grown from the top surface of material 222 and vertical side surfaces having a (110) crystal oriented material along or adjacent to sidewalls 113 and 115. Material 226 may have side surfaces 223 and 224 extending height H3, having (110) crystal oriented material, and parallel to sidewalls 113 and 115. In some embodiments, crystalline defects may exist in material 222 and 226 near or along the sidewalls 113 and 115 of the STI forming the trenches. In some embodiments, crystalline defects may exist in material 226 due to defects, including the Stacking faults that originate at the STI sidewalls 113 or 115, that still remain within upper trench 105. In some cases, these defects may discontinue or not exist above height H1, and thus may not exist within height H3.

Height H3 of FIG. 4A may be the same as noted for FIG. 3A. Height H4 of FIG. 4A may be the same as noted for FIG. 3A.

In some cases, height H3 is great enough or sufficient to allow exposed sidewalls material 226 having height H3 to be selectively (e.g., with respect to material 228 and 244 (and 222)) horizontally etched (e.g., as noted for FIGS. 4B-C and 5) to remove height H3 or all of material 226 to form a nanowire (1) of material 142 having height H4 and sidewalls 152 and 154 (e.g., nanowire 150); or (2) of materials 228, 142 and 244 (e.g., stack 250). This may be due to material 226 being selectively etched to (1) remove the all of material 226, but (2) not remove material 142 due to capillary effect of no lateral etch of material 142 due to height H4 of material 142 being thin enough that sidewalls 152 and 153 are not sufficiently accessible or etched by the etchant to remove material 142 (e.g., from between thin layers 228 and 244). In some cases, this etch is selected to be unable to etch the second thickness of the second channel layer due to the combination of the top and bottom surface of material 142 being protected by layers 228 and 244 and due to only thin height H4 of side surfaces of layer 142 being exposed between layers 228 and 244 for the etch.

Figure 4B:
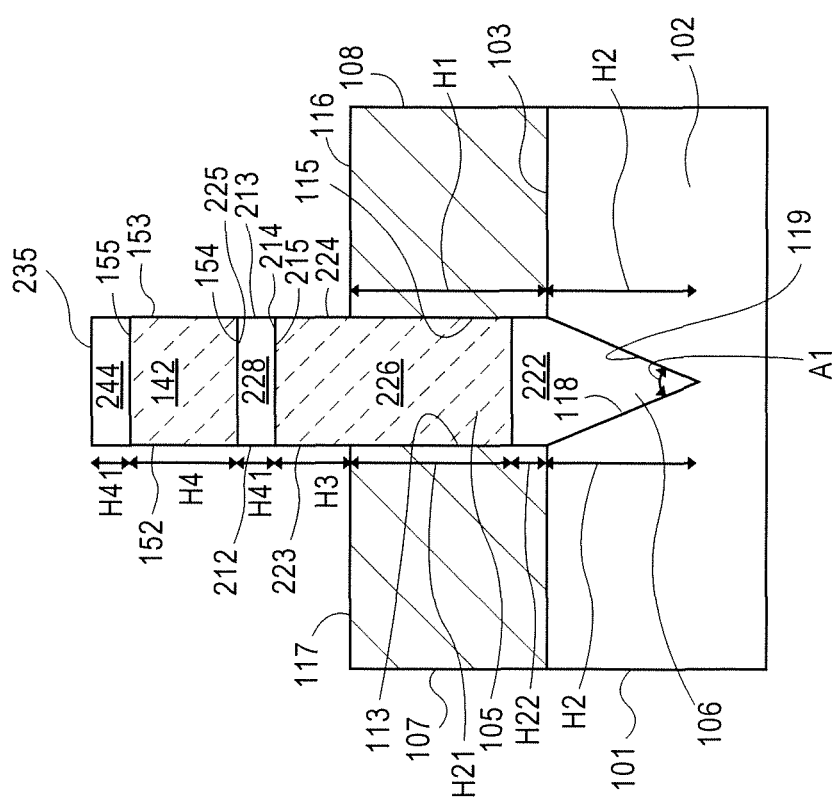
FIG. 4B shows the semiconductor substrate of FIG. 4A after etching STI regions to remove a height of them and to expose a height of the sacrificial sub-fin material that can be etched.

For example, the capillary effect of the etch may describe a situation where, due to the selectivity of etching material 226 and 142, but not 228 and 244, exposed sidewalls of material 142 are physically protected on top surface 155 and bottom surface 154 by un-etched layers 244 and 228, respectively (e.g., as noted for FIGS. 4B-C and 5). Thus, these surfaces will not be etched, although, side surfaces 152 and 153 are expose to the etching. However, due to the nature of the etch, such as a wet isotropic etch, the etching is unable to remove a substantial amount of material 142, at surfaces 152 and 153, because they are side surfaces, disposed in a vertical direction (as apposed to a top surface, such as surface 235 or, if exposed, surface 155). In some cases, height H4 is selected specifically so that the capillary effect causes an insubstantial width of material 142 to be etched from side surfaces 152 and 153. In some cases, the width of material 142 etched from each of side surfaces 152 and 153 may be between 1 and 2 nanometers. For example, height H4 may be selected so that less than 10%, 5%, 2% or 1% of width W1 of material 142 is removed from surfaces 152 and 153, combined. In some cases, height H4 may be selected so that less than 1 or 2 nm of width W1 of material 142 is removed from surfaces 152 and 153, combined.

On the other hand, height H3 may be selected to be larger than H4. Moreover, height H3 may be selected to be large enough that during such an etch (e.g., as noted for FIGS. 4B-C and 5) capillary effect does not prohibit substantial etching of material 226 from surfaces 223 and 224 (e.g., such as noted in the amounts above). In this case, the same etch may be used to etch away all of width W1 of material 226 within at least height H3; but not to substantially etch material 142 within height H4, as noted above.

Material 226 may have top surface 215 having a (100) crystal orientation (Miller Index). In some cases, the top surface of material 226 forms a flat surface having a (100) crystal index. Material 226 may have width W1 between sidewalls 113 and 115. Material 226 may have a length L1.

In some cases, junction regions (e.g., source and drain) are formed at the ends of material 226 prior to removal of material 226, so that when material 226 is removed or etched, the remaining nanowire or ribbon (e.g., of material 142; or of materials 228, 142 and 244) is suspended over the opening formed where sub-fin material 226 was removed (e.g., as noted for FIGS. 4B-C and 5). Side surfaces 223 and 224 may be etched to remove height H3 or all of material 226 to form such a nanowire of material 142.

The crystal lattice of material 226 may be a different size than (e.g., a lattice mismatch with) the crystal lattice of material 222. Thus, material 222 may induce a strain in material 226. This strain may be caused by the lattice mismatch with material 222 at the interface between the materials. This strain may be bidirectional or unidirectional. The strain in material 226 may be a strain caused by the lattice mismatch as known in the art. Because layer 226 is a thick layer, if there is a lattice mismatch with material 102, then material 226 will be thicker than the critical thickness and will relax, resulting in defects which because it is a thick layer, deep in the ART trench, but the height H3 of material of 226 should then be defect free. In some cases, because it is a buffer layer and it is thick, material 226 will be relaxed and defective free at its top surface. In some cases, the critical thickness above which the material will relax may be a thickness of less than 6 nm, so there will be no strain in material 226 above Height H1 or at surface 125. Material 226 may be a relaxed material (e.g., have a non-strained lattice) at height H1 or at surface 125.

FIG. 4A shows material 226 having top surface 215 upon which or from which a first channel layer of channel material 228 is epitaxially grown. Material 128 may be a buffer layer of a "sacrificial" layer or material that will be subsequently removed or etched, such as when material 222 is etched (e.g., as noted for FIGS. 4B-C and 5). However, in some cases, material 228 is a first thin film of a first channel material that will remain attached to channel layer 142 when the gate is formed.

Material 228 has bottom surface 214, such as a surface atomically bonded to or epitaxially grown from (e.g., touching) surface 215. Material 228 also includes top surface 225. According to some embodiments, material 228 may be formed by epitaxial growth as noted above for forming material 226 or 222, and may only grow from "seed" top surface 215 of material 226. Material 228 may be an epitaxially grown defect free, single crystal material, grown from a single crystal defect free surface 215 of material 226.

Material 228 that has height H41 above surface 215. Material 228 may have a bottom surface having a (100) crystal oriented material grown from surface 215, and side surfaces 212 and 213 having a (110) crystal oriented material. Side surfaces 212 and 213 may be continuations of (e.g., extend parallel from or above) side surfaces 223 and 224 of material 226, such as by both side surfaces being grown in trench 105. In some embodiments, crystalline defects may not exist in material 228 due to the use of buffer layer 226. In some cases, the defects in layer 226 discontinue at or not exist within height H3 and thus are not continued or carried into material 228.

Height H41 of material 228 (and material 244) may be a height of between 1-10 nanometers (nm). In some cases, height H41 may be less than 10 nanometers. In some cases, height H41 is 1, 2, 5, or 10 nanometers. In some cases, height H41 is 10 nanometers. In some cases height H41 is 2 nanometers. In some cases H41 is approximately 2 nm. Height H41 may be a height of less than 5 nm. In some cases H41 is between 1 and 5 nm. In some cases, height H41 may be between 1 and 3 nanometers.

Material 228 may have top surface 225 having a (100) crystal orientation (Miller Index). In some cases, the top surface of material 228 forms a flat surface having a (100) crystal index. Material 228 may have width W1 between side surfaces. Material 228 may have a length L1.

In some cases, junction regions (e.g., source and drain) are formed at the ends of material 228 prior to removal of material 226, so that when material 226 is removed or etched, the remaining nanowire or ribbon (e.g., of material 142; or of materials 228, 142, and 244) is suspended above where material 226 was removed. Side surfaces 212 and 213 (and optionally, bottom surface 214) may be etched to remove height H41 or all of material 228 to form nanowire 150 of material 142 (which may be formed by simultaneously etching material 228 and 244 (and optionally etching material 222).

The crystal lattice of material 228 may be a different size than (e.g., a lattice mismatch with) the crystal lattice of material 226. Thus, material 226 may induce a strain in material 228. This strain may be unidirectional due to surface 215. The strain in material 228 may be a strain caused by the lattice mismatch as known in the art. In some cases, material 228 can be strained with respect to material 226 and the strain is bidirectional (e.g., due to crystal lattice mismatch at surface 215). In some cases, because the fins are long in length L1 but short in width W1, the narrow direction of this strain is small because the strain can relax in the width direction for narrow fins and thus this strain converts to a unidirectional strain along the length L1 of the fin.

In some cases, because of H41 being thin, material 228 transfers the strain in material 228 to material 142 because there is not enough thickness in H41 for material 228 to relax. In other cases, material 228 may be a relaxed material (e.g., have a non-strained lattice) with respect to its interface with the lattice of material 226 at surface 215. In some cases, material 144 is a strained layer (unidirectionally or bidirectionally) with respect to the substrate (e.g., material 102).

In cases where height H41 is great enough, strain may exist in layers 228 and 244 due to the lattice size of materials 228 and 244. However, according to embodiments, height H41 is thin or small enough that there is no independent strain caused by or resulting from lattice mismatches between these materials and material 226 or 142. In these embodiments, height H41 is small enough that strain in layer 228 exists due to a lattice mismatch between layer 226 and layer 228. Moreover, such strain is continued through layer 228 and causes strain on layer 142 based on the lattice mismatch between surface 215 of layer 226 and surface 154 of layer 142.

Also, H1 of layer 244 is thin enough that there is no independent strain caused by layer 244 on surface 155 of layer 142. In other embodiments, layer 244 is thick enough to cause a strain on layer 142, in addition to the strain caused by layer 226.

FIG. 4A shows material 228 having top surface 225 upon which or from which a (second) channel layer of (second) channel material 142 is epitaxially grown. Material 142 of FIG. 4A may be a channel material for a transistor (e.g., single material or part of a stack of channel materials to be a channel of a MOS device). Material 142 of FIG. 4A has bottom surface 154, such as a surface atomically bonded to or epitaxially grown from (e.g., touching) surface 225. Material 142 also includes top surface 155, from which a third channel layer of third channel material 244 is epitaxially grown. Material 142 is also shown having vertical side surfaces 152 and 153. These surfaces may be continuations of side surfaces of material 228. According to some embodiments, material 142 of FIG. 4A may be formed by epitaxial growth as noted for FIG. 3A, except that it is grown from surface 225 instead of surface 125. Material 142 of FIG. 4A may be an epitaxially grown defect free, single crystal material, grown from a single crystal defect free surface 225 of material 228.

Material 142 of FIG. 4A that has height H4 above surface 225. Material 142 may have bottom surface 154 having a (100) crystal oriented material grown from surface 225, and vertical side surfaces 152 and 153 having a (110) crystal oriented material. Side surfaces 152 and 153 of FIG. 4A may be continuations of (e.g., extend parallel from or above) side surfaces 212 and 213 of material 228, such as by both side surfaces being formed in trench 105. In some embodiments, crystalline defects may not exist in material 142 due to the use of buffer layer 222 and 226. In some cases, the defects in layer 226 discontinue at or not exist within height H3 and thus are not continued or carried into material 142 of FIG. 4A.

Height H4 of FIG. 4A may be the same as noted for FIG. 3A. In some cases, height H3 is great enough or sufficient to allow exposed side surfaces of material 122 at height H3 to be selectively (e.g., with respect to material 142) horizontally etched to remove height H3 or all of material 122 to form stack 250 (having material 142 having height H4 and sidewalls 152 and 154) (e.g., as noted for FIGS. 4B-C and 5).

Material 142 of FIG. 4A may have top surface 155 having a (100) crystal orientation (Miller Index). In some cases, the top surface of material 142 forms a flat surface having a (100) crystal index. Material 142 may have width W1 between side surfaces 152 and 153. Material 142 may have a length L1.

In some cases, junction regions are formed at the ends of material 142 of FIG. 4A prior to removal of material 226, so that when material 226 is removed or etched, the remaining nanowire or ribbon of material 142 (or materials 228, 142 and 244) is suspended over the opening formed where sub-fin material 226 was removed. Side surfaces 223 and 224 may be etched to remove height H3 or all of material 226 to form such a stack 250 of materials 228, 142 and 244.

Figure 4D:
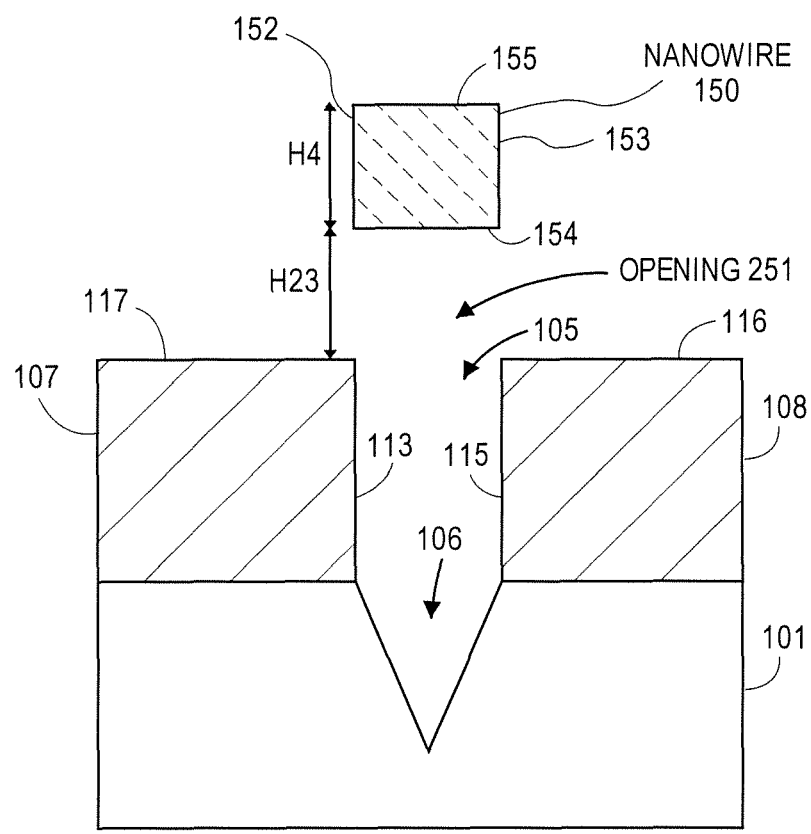
FIG. 4D shows the semiconductor substrate of FIG. 4C after etching to remove thin film channel materials to form an electronic device nanowire from a height of a remaining channel layer extending above etched top surfaces of the STI regions.

For example, the junctions regions can be formed by protecting a length at the ends of the fin of FIG. 4A or B with a photo resist, to protect the end portions of layers 222, 226 and 142 from the etch, while allowing a "gate" etch of FIG. 4D to etch a center portion of the fin (e.g., a portion between the end portions where the junction regions will be formed) thus removing the sub channel material 222 and forming the stack 250 or nanowire 150 suspended over the opening formed in the center portion, between the junction regions, below the channel material.

The crystal lattice of material 142 may be a different size than (e.g., a lattice mismatch with) the crystal lattice of material 228. Thus, material 228 may induce a strain in material 142 of FIG. 4A. This strain may be unidirectional and/or bidirectional due to the crystal lattice mismatch between surface 225 and 154. The strain in material 142 may be a strain caused by the lattice mismatch as known in the art. Due to forming the junction regions, this strain may continue to exist, or remain in the channel layer of material 142, after material 226 (and optionally 228) is etched away. Carrier mobility of holes or electron carriers may be increased due to the compressive or tensile strain in material 142 of FIG. 4A, respectively.

In some cases, material 142 can be strained with respect to material 228 or 226 and the strain is bidirectional due to crystal lattice mismatch between material 142 at surface 154 and that of the top surface of material 228 or 226. In some cases, because of H5 being thin, material 142 is not strained with respect to the lattice of material 144 but is strained by material 228 transferring the strain in material 228 (caused by material 226) to material 142 because there is not enough thickness in H41 for material 228 to relax. In some cases, because the fins are long in length L1 but short in width W1, the narrow direction of this strain is small because the strain can relax in the width direction for narrow fins and thus this strain converts to a unidirectional strain along the length L1 of material 142.

In other cases, material 142 of FIG. 4A may be a relaxed material (e.g., have a non-strained lattice) with respect to its interface with the lattice of material 228 at surface 225 and 154. In some cases, material 142 is a strained layer (unidirectionally or bidirectionally) with respect to the substrate (e.g., material 102; or sidewalls 118 and 119).

FIG. 4A shows material 142 having top surface 155 upon which or from which a third channel layer of channel material 244 is epitaxially grown. Material 244 may be a "sacrificial" layer or material that will be subsequently removed or etched, such as when material 222 is etched (e.g., as noted for FIGS. 4B-C and 5). However, in some cases, material 244 is a third thin film of a third channel material that will remain attached to channel layer 142 when the gate is formed.

Material 244 may have a bottom surface, such as a surface atomically bonded to or epitaxially grown from (e.g., touching) surface 155, similar to material 144. Material 244 may be an epitaxially grown defect free, single crystal material, grown from a single crystal defect free surface 155 of material 142.

Material 244 that has height H41 above surface 155. Material 244 may have a bottom surface having a (100) crystal oriented material grown from surface 155, and side surfaces having a (110) crystal oriented material. Those side surfaces may be continuations of (e.g., extend parallel from or above) side surfaces 152 and 154 of material 142, such as by both side surfaces being grown within trench 105. In some embodiments, crystalline defects may not exist in material 144 due to the use of buffer layer 226. In some cases, the defects in layer 226 discontinue at or not exist within height H3 and thus are not continued or carried into material 228. In some cases, height H41 of material 244 is the same as that of height H41 of material 228.

Material 244 may have top surface 235 having a (100) crystal orientation (Miller Index). The top surface of material 244 may be polished or etched to form a flat surface having a (100) crystal index. Material 244 may have width W1 between side surfaces. Material 244 may have a length L1.

In some cases, junction regions (e.g., source and drain) are formed at the ends of material 244 prior to removal of material 226, so that when material 226 is removed or etched (e.g., as noted for FIGS. 4B-C and 5), the remaining nanowire or ribbon (e.g., of material 142; or of materials 228, 142, and 244) is suspended above where material 226 was removed. Side surfaces (and optionally, top surface) of material 244 may be etched to remove height H41 or all of material 244 to form nanowire 150 of material 142 (which may be formed by simultaneously etching material 228 and 244 (and optionally etching material 222).

For example, the junctions regions can be formed by protecting a length at the ends of the fin of FIG. 4A or B with a photo resist, to protect the end portions of layers 222, 226, 142 and 244 from the etch, while allowing a "gate" etch of FIG. 4D to etch a center portion of the fin (e.g., a portion between the end portions where the junction regions will be formed) thus removing the sub channel material 222 and forming the stack 250 or nanowire 150 suspended over the opening formed in the center portion, between the junction regions, below the channel material.

The crystal lattice of material 244 may be a different size than (e.g., a lattice mismatch with) the crystal lattice of material 142. Thus, material 244 may induce a strain in material 142. This strain may be unidirectional due to surface 155. The strain in material 142 may be a strain caused by the lattice mismatch as known in the art.

In some cases, material 142 can be strained with respect to material 244 and the strain is bidirectional (e.g., due to crystal lattice mismatch at surface 155). In some cases, because the fins are long in length L1 but short in width W1, the narrow direction of this strain is small because the strain can relax in the width direction for narrow fins and thus this strain converts to a unidirectional strain along the length L1 of the fin. In some cases, because of H41 being thin, material 142 is not strained with respect to material 244 because there is not enough thickness in H41 for material 244 to cause a strain in material 142.

Material 244 may be a relaxed material (e.g., have a non-strained lattice) with respect to its interface with the lattice of material 142 at surface 155. In some cases, material 244 is a strained layer (unidirectionally or bidirectionally) with respect to the substrate (e.g., material 102).

In some cases, forming material 244 includes forming a height of material 244 above the top surfaces of STI regions 107 and 108, and then polishing material 244 and the top of the STI regions to form the structure shown in FIG. 4A. One benefit of forming layer 244 is that when layer 244 is subsequently polished (e.g., by CMP) any damage to the crystalline structure of layer 244 due to or resulting from the polishing, will not damage layer 142. In other words, if layer 244 did not exist, and instead, layer 142 and the STI regions were polished to form a flat top surface, damage resulting from such polishing would exist in material 142. Instead, by forming layer 244, layer 142 is not damaged by the polish that would be otherwise used to form height H5 of material 142.

In addition, an advantage of forming layer 244 is that it is possible to more accurately grow material 142 to height H4, and subsequently grow material 244 which will be etched so that height H4 of material 142 remains. On the other hand, it is more difficult to accurately polish material 142 to form height H4 than it is to grow material 142 to height H4. In other words, it is easier to control the height that material 142 would be epitaxially grown to (e.g., height H4) than it is to control the height which material 142 would be polished to.

In some cases, surfaces 125, 153, 155 and 135 may all have (100) crystal orientation. Surfaces 152 and 153 may have (110) crystal orientation.

FIG. 4B shows the semiconductor substrate of FIG. 4A after etching STI regions to remove a height of them and to expose a height of the sacrificial sub-fin material that can be etched. FIG. 4B shows the semiconductor substrate of FIG. 4A after etching STI regions 107 and 108 to remove height HS and to expose heights H3, 2×(H41) and H4 of the fin materials. In some embodiments, after FIG. 4A, an "oxide" etch is used to remove height HS of material 104 to form top surfaces 117 of regions 107 and 116 of region 108 of STI material. The top surfaces 116 and 117 are at height H1, and leave side surfaces 223 and 224 of height H3 of material 226 exposed. The etch may expose height H3 of the sacrificial sub-fin material 226 that is a sufficient height that can be etched as noted herein. The etch leaves side surfaces 212 and 213 of height H41 of material 228 exposed. The etch leaves side surfaces 152 and 153 of height H4 of material 142 exposed. The etch also leaves side surfaces 146 and 147 of heights H41 of material 244 exposed. In some cases the etch may be a hydrogen fluoride (HF) etch or a hydrogen chloride (HCl) etch as known in the art to remove the STI material or oxide material of height HS of material 104.

In some cases the etch may include patterning and etching material 104 to form surfaces 116 and 117 at height H1 using a resist or hard mask to cover all of top surface 235 material 244. In some cases 1, 2, or 3 resist layers may be used for the patterning materials. In some cases, patterning and etching material 104 to form the STI regions includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature. This etch may or may not stop at surfaces 116 and 117 or at height H1.

FIG. 4C shows the semiconductor substrate of FIG. 4B after etching to remove a sacrificial sub-fin material 226 to form an electronic device stack from height of the stack of channel material extending above etched top surfaces of the STI regions. FIG. 4C shows the semiconductor substrate of FIG. 4B after etching to remove material 226 to form an electronic device stack 250 from height H4 and 2×H41 (width W1 and length L1) of the stack extending above etched top surfaces of the STI regions.

According to embodiments, material 226 may be selectively etched with respect to materials 228 and 244 by using an etch chemistry that is selected or known to etch material 226 without etching materials 228 and 244. Etching to remove Height H3 or all of material 226 may be etched by wet or dry etching. In some cases, such etching by use a wet etch (e.g., of HF) or a dry etch chemistry.

In some cases, the etch may be an isotropic wet etch that with an etch chemistry selected that etches material 226 horizontally to remove at least thickness W1 of height H3 or a portion of height H3 of material 226 across width W1, but the chemistry does not remove material 142. In some cases, the etch may be a subtractive etch, such as to etch away material 226, with the exception of other materials, such as materials 228 and 244. In some cases, the etch may use Chlorine or another acidic dry etch chemistry. In some cases, material 226 is selectively etched using a wet etch (e.g., of HF) or a dry etch to remove all of material 226.

The etch may use a selected wet etch chemistry (etchant) and etch time for the removal. The chemistry may be a citric wet isotropic etch to remove InGaAs but not larger lattice InP (e.g., where materials 226 and 142 are InGaAs which is tensile strained by larger lattice InP material 228 and/or 222 for an NMOS device). In some cases, the chemistry may be an HCl wet isotropic etch to remove InP but not InGaAs (e.g., to etch thin film layers 228 and 244 of InP of FIG. 4D). These selective wet etches may be used to form a NMOS device, such as device where the percentages of different type III/V material are chosen for materials of FIGS. 4A-D to result in a tensile strain along length L1 of stack 250 or nanowire 150 to cause in increase in electron carrier mobility between the junction regions. For instance, material 222, 228 and 244 may be InP, while materials 226 and 142 are InGaAs.

It is considered that other proper type III/V materials and selective etchants of those materials may be selected based on the percentages of different type III/V material chosen to create the devices of FIGS. 4A-D. These selections may also apply to the processes of FIG. 5.

Alternatively, the chemistry may be a Citric, Nitric, or HF wet isotropic etch to remove silicon germanium but not smaller lattice silicon (e.g., where materials 226 and 142 are SiGe which is compressive strained by smaller lattice Si material 228 and/or 222 for a PMOS device). In some cases, the chemistry may be an ammonium hydroxide wet isotropic etch to remove silicon but not larger lattice silicon germanium (e.g., to etch thin film Si layers 228 and 244 of FIG. 4D). In some cases, the chemistry may be an ammonium sulfide wet isotropic etch to remove silicon germanium but not larger lattice germanium.

These selected wet etches may be used to form a PMOS device, such as device where the percentages of silicon and germanium are chosen for materials of FIGS. 4A-D to result in a compressive strain along length L1 of stack 250 or nanowire 150 to cause in increase in hole carrier mobility between the junction regions. For instance, materials 226 and 142 may be Ge; while materials 222, 228 and 244 are Si. In another case, materials 226 and 142 may be Ge; while materials 222, 228 and 244 are SiGe. In another case, materials 226 and 142 may be SiGe; while materials 222, 228 and 244 may be Si.

It is considered that other proper type IV material percentages (e.g., of Si and Ge) and selective etchants of those materials may be selected based on the percentages of different type IV material chosen to create the devices of FIGS. 4A-D. These selections may also apply to the processes of FIG. 5.

It can be appreciated that as compared to the selective etch that does not etch the channel material 142 of FIGS. 3A-D, selecting an etch (e.g., chemistry) that does etch channel material 142 of FIGS. 4A-D is counterintuitive and provides the unexpected benefit of allowing thin film layers 228 and 244 to be used to protect channel material 142 of FIGS. 4A-D. It also provides the unexpected benefit described herein of forming stack 250 including those of having the thin film layers on the channel material to increase carrier mobility.

In some cases, the etch may include selectively etching to remove the sub-fin buffer layer of fin sacrificial material by selectively etching to (1) remove the second material of the second buffer layer, (2) but not etch the first material of the first buffer, the first channel and the third channel layer, to form the nanowire as a stack of the first, second and third channel layers; and (3) not etch the second material of the second channel layer due to a capillary effect of no lateral etch of the second channel layer.

In some cases, the etch may include selectively etching to remove the first height includes selecting an isotropic wet etch chemistry to etch the second material of the second buffer layer but not the first material of the thin channel layers and not to remove the second material of the second channel layer due to a capillary effect of the etch being unable to etch the second thickness of the second channel layer.

Such etching may use a "timed" etch, such as an etch for a period of time known to remove height H3 or all of material 226; or may use another process that is know to perform such etching. After the etch, channel layer of material 142 (or of materials 228, 142, and 244) may be or include an "exposed" device well or gate layer extending or disposed height H3 above the etched STI regions 108 and 107.

In some cases, material 226 is selectively etched to (1) remove the all of material 226, but (2) not remove material 142 due to capillary effect of no lateral etch of material 142 due to height H4 of material 142 being thin enough that sidewalls 152 and 153 are not sufficiently accessible or etched by the etchant to remove material 142 (e.g., from between thin layers 228 and 244) to form stack 250. In some cases, this selective etch includes leaving height H22 (and H2) of material 222 in trench 105 and 106. In some cases, this selective etch includes removing all of material 266; none of material 222; none of material 228 and 244; and none or a functionally irrelevant (e.g., as a channel) thickness of material 142 (e.g., from or at side surfaces 152 and 153). It is considered that in some cases, materials 228, 142 and 244 may be formed with a width greater than W1 so that remaining material 142, after the selective etch, has width W1.

After the etch, stack 250 of materials 228, 142, and 244 has exposed side surfaces that may be planar surfaces parallel to and aligned with (e.g., directly above) planar sidewalls 113 and 115. These surfaces; bottom surface 214; and top surface 235 of the stack of materials 228, 142, and 244 may be considered "exposed" after etching an before growth of a material from or on these surfaces, such as growth a device gate or gate dielectric layer on all 4 of the exposed surfaces of the stack.

Stack 250 may be an epitaxially grown channel fin layer or nanowire layer of a first epitaxial material (e.g., to become a P- or N-type material) having exposed surfaces of materials 228, 142, and 244. In some cases, stack 250 may be a "device" layer, such as a layer on or in which circuit devices are formed, as known in the art. Thus, stack 250 may provide electronic device material (e.g., wells and/or channels) in which defect free nanowire (e.g., fin or "quad-gate") based devices may be formed. In some cases, stack 250 may be a channel layer (e.g., a "quad-channel" or "quad quantum well") or nanowire having exposed 4 sides upon or on which a "device" or gate dielectric or material will be formed, as known in the art. Stack 250 may have exposed surfaces of materials 228, 142, and 244 extending above an etched opening 151, height H3 above top surfaces of STI regions 107 and 108.

In some cases, junction regions are formed at the ends of stack 250 (e.g., prior to removal of material 226) so that the stack is suspended over the opening formed where sub-fin material 226 was removed (e.g., at least opening 151; and optionally trench 105 and 106, such as noted for FIGS. 4B-C and 5).

The crystal lattice of materials of stack 250 may be a different size than (e.g., a lattice mismatch with) the crystal lattice of material 226. Thus, material 226 may have induced a strain in materials of stack 250 that remains or continues to exist after removal or etching of material 226. The strain may remain due to the ends of stack 250 being anchored in or bonded to (e.g., between) the junction regions. For example, due to formation of materials of stack 250 having ends formed in or on the junctions regions, strain induced into the stack by material 226 remains even after material 226 is removed because the length of stack 250 does not change after removal of material 226. Thus, a compressive or tensile strain in stack 250 remains. This strain may be unidirectional and/or bidirectional due to the crystal lattice mismatch between surface 215 and 214 when stack 250 is grown. In some cases, this strain is unidirectional since material 226 is removed and the lattice mismatch between that materials and materials of stack 250 no longer exists, but the length of materials of stack 250 has not changed. The strain in stack 250 may be a strain caused by the lattice mismatch as known in the art.

In some cases, stack 250 has a bidirectional strain along the length L1 of the stack 250 with respect to the substrate (e.g., material 102). This may be due to stack 250 width W1 being greater than 6 nm. In some cases, stack 250 has a unidirectional strain along the length L1 of the stack 250 with respect to the substrate (e.g., material 102). This may be due to stack 250 width W1 being less than 6 nm. In some cases, stack 250 has no strain along the length L1 of the stack 250 with respect to the substrate (e.g., material 102). This may be due to stack 250 height $H4+2 \times H41$ being less than 6 nm; and/or no lattice mismatch between material 142 and 226.

After FIG. 4C a first conformal thickness of a first conformal epitaxial "cladding" material may be grown from all 4 exposed surfaces of the electronic device stack 250 as described for forming a first conformal thickness of a first conformal epitaxial "cladding" material grown from all 4 exposed surfaces of the electronic device nanowire of FIG. 3D.

According to embodiments, including the first and third thin channel layers 228 and 244 in channel stack 250 provides additional advantages. Such a configuration may be described as a quantum well structure due to the existence of the thin layers (material 228 and 244) on the top and bottom of the channel, which restrains or restricts carriers to move within the channel (e.g., between junction regions such as source and drain). Such a configuration also reduces carriers from being scattered in directions other than directions from one junction region to another. For example, a gate insulator (e.g., dielectric or oxide) that is directly formed on or bonded to the surfaces of channel material 142 may cause scattering of carriers due to the polar bonds of oxide material that are directly bonded to material 142. However, in the case of stack 250, the gate oxide or insulator is bonded to layers 228 at the bottom of the channel and to layer 244 at the top of the channel. Thus the carriers moving between junction regions along surface 154 and 155 of channel material 152 will not experience the scattering caused by the oxide polar bonds because the gate oxide or insulator is not bonded directly to those surfaces, but instead is bonded to surfaces 214 and 235 of material 225 and 244, respectively.

According to some embodiments, the quantum well using stack 250 provides higher carrier mobility and less scattering of carriers by confining the carriers or restraining the carriers within material 142 so that they are only exposed to the oxide bonds of the gate insulator, dielectric, or oxide along surfaces 152 and 153, but not along surfaces 154 and 155.

FIG. 4D shows the semiconductor substrate of FIG. 4C after etching to remove thin film channel materials to form an electronic device nanowire from a height of a remaining channel layer extending above etched top surfaces of the STI regions. FIG. 4D shows the semiconductor substrate of FIG. 4C after etching to remove materials 228 and 244 (and optionally 222) to form an electronic device nanowire 150 from height H4 (width W1 and length L1) of the channel layer (e.g., material 142) extending height H3+H41 above etched top surfaces of the STI regions.

According to embodiments, materials 228 and 244 (and optionally 222) may be selectively etched with respect to material 142 by using an etch chemistry that is selected or known to etch materials 228 and 244 (and optionally 222) without etching material 142. Etching to remove Height H41 or all of materials 228 and 244 (and optionally 222) may be etched by wet or dry etching. In some cases, such etching by use a wet etch (e.g., of HF) or a dry etch chemistry.

In some cases, the etch may be an isotropic wet etch that with an etch chemistry selected to etch (remove) materials 228 and 244 horizontally to remove them completely to expose all sides of material 142. In some cases, the etch may be a subtractive etch, such as to etch away all of materials 228 and 244, with the exception of other materials, such as material 142. In some cases, the etch may use Chlorine or another acidic dry chemistry. In some cases, materials 228 and 244 are selectively etched using a wet etch (e.g., of HF) or a dry etch to remove all of materials 228 and 244.

The etch may use a selected etch chemistry (etchant) and etch time for the removal. In one example, the chemistry may be a HCl wet isotropic etch to remove InP but one InGaAs (e.g., to etch thin film Si layers 228 and 244 of FIG. 4D). In some cases, the chemistry may be an ammonium hydroxide wet isotropic etch to remove silicon but not larger lattice silicon germanium (e.g., to etch thin film Si layers 228 and 244 of FIG. 4D). Other examples of such materials and etchants are provided above.

Such etching may use a "timed" etch, such as an etch for a period of time known to remove all of materials 228 and 244 (and optionally material 222); or may use another process that is know to perform such etching. After the etch, channel layer of material 142 may be or include an "exposed" device well or channel layer extending or disposed height H3+H41 above the etched STI regions 108 and 107. In some cases material 222 is etched away during the etch of materials 228 and 244.

After the etch, nanowire 150 of material 142 has exposed side surfaces 152 and 153 that may be planar surfaces parallel to and aligned with (e.g., directly above) planar sidewalls 113 and 115. In some cases, nanowire 150 of FIG. 4D is the same as that of FIG. 3C, except for being suspended height H3+H41 instead of height H3 above the etched STI regions 108 and 107.

In some cases, junction regions are formed at the ends of nanowire 150 (e.g., prior to removal of material 226, 228 and 244) so that the nanowire of material 142 is suspended over the opening formed where sub-fin material 226 and 228 were removed (e.g., at least opening 151; and optionally trench 105 and 106, such as noted for FIGS. 4B-C and 5).

The crystal lattice of material 142 of nanowire 150 may be a different size than (e.g., a lattice mismatch with) the crystal lattice of material 228 and 244. One or more of these, materials may have induced a strain in material 142 of nanowire 150 that remains or continues to exist after removal or etching of materials 228 and 244. The strain may remain due to the ends of Nanowire 150 being anchored in or bonded to (e.g., between) the junction regions. For example, due to formation of material 142 having ends formed in or on the junctions regions, strain induced into material 142 by those materials remains even after materials 228 and 244 are removed because the length of material 142 does not change after removal of materials 228 and 244. Thus, a compressive or tensile strain in material 142 of nanowire 150 remains. This strain may be unidirectional and/or bidirectional due to the crystal lattice mismatch between surfaces 155 and 154 and those of materials 228 and 244 when material 142 is grown. In some cases, this strain is unidirectional since materials 228 and 244 are removed and the lattice mismatch between those materials and material 142 no longer exists, but the length of material 142 has not changed. The strain in material 142 may be a strain caused by the lattice mismatch as known in the art.

In some cases, nanowire 150 has a bidirectional strain along the length L1 of the fin with respect to the substrate (e.g., material 102). This may be due to a nanowire 150 width W1 being greater than 6 nm. In some cases, nanowire 150 has a unidirectional strain along the length L1 of the fin with respect to the substrate (e.g., material 102). This may be due to a nanowire 150 width W1 being less than 6 nm. In some cases, nanowire 150 has no strain along the length L1 of the fin with respect to the substrate (e.g., material 102). This may be due to a nanowire 150 height H4 being less than 6 nm; and/or no lattice mismatch between material 142 and 122.

After FIG. 4D a first conformal thickness of a first conformal epitaxial "cladding" material may be grown from all 4 exposed surfaces of the electronic device nanowire (e.g., of nanowire 150) as described for forming a first conformal thickness of a first conformal epitaxial "cladding" material grown from all 4 exposed surfaces of the electronic device nanowire of FIG. 3D.

According to embodiments, nanowire 150 of FIGS. 3C and 4D may be used to form a fin field effect transistor (FET) that includes material 142 as a channel layer upon which a quad-gate based device is formed. In some cases, stack 250 shown in FIG. 4C may be a quantum well nanowire device, such as by providing the side surfaces, top surface, and bottom surface of stack 250, upon which a quad-gate based device is formed. Either the fin FET or quantum wire device may be a P-type metal oxide semiconductor (MOS) or N-type MOS device. Moreover, the P-type device may be paired with an N-type device to form a complimentary MOS (CMOS) device.

In some cases, a germanium (Ge) and silicon (Si) material technology is used, to form such a P-MOS FET or quantum well device. In other case, an indium phosphate (InP) and indium gallium arsenide material (InGaAs) is used to form an N-MOS fin FET or quantum well device.

Such a device may have superior carrier mobility and lower gate threshold due to having the quad-gate, for sighted channel structure because the gate may now apply an electrical bias to the channel on all 4 sides (as opposed to other devices which can only provide biasing on 2 or 3 sides). Moreover, since the carriers travel mainly at or below the surface of the channel, in addition to bias and 4 sides, there are 4 side surfaces upon or under which the carrier may travel (as opposed to other devices that have only 2 or 3 channel sides being biased by the gate).

In some cases, material 122, 144, 222, 228 and 244 are the same material, such as by being a "first" material, (e.g., a type IV (e.g., Ge/Si) or type III/V material), as known in the art, such a material may be found in the third, fourth and fifth column of the periodic table of chemical elements. In these embodiments, materials 142 and 226 may be a different, "second" material, (e.g., a type IV (e.g., Ge/Si) or type III/V material).

In some cases, the first material is a type III/V material (e.g., indium phosphate (InP)); and the second material is a type III/V material (e.g., indium gallium arsenide (InGaAs)). In these cases, the stack 250 or wire 105 may be for an NMOS device. One example of a NMOS device uses indium gallium arsenide for material 142 and indium phosphate for material 122 (and optionally 144). Thus, material 142 in stack 250 or nanowire 150 may experience tensile strain which may increase electron carrier mobility. Hydrogen chloride may be selected to selectively etch indium phosphate with the exception of not etching indium gallium arsenide. Citric acid may be selected to selectively etch indium gallium arsenide, with the exception of not etching indium phosphate.

In other cases, the first material may be a silicon material, while the second material is a silicon germanium material. One example of a PMOS device uses silicon for material 142 and silicon germanium or germanium for material 122 (and optionally 144). In another embodiment, a PMOS device uses silicon germanium for material 142 and germanium for material 122 (and optionally 144). Thus in these cases, material 142 in stack 250 or nanowire 150 may experience a compressive strain. Ammonium hydroxide may be selected to selectively etch silicon with the exception of not etching silicon germanium. In some cases, ammonium sulfide may be selected to selectively etch silicon germanium with the exception of not etching germanium. Also, Citric, Nitric, or HF may be selected to selectively etch silicon germanium, with the exception of not etching silicon.

Other materials considered for the type III/V materials are gallium arsenide, indium arsenide, and gallium phosphate. Selection of these materials to be used as the first material and the second material based on the ability to selectively etch the materials, and provide capillary effect, and provide strain in the channel material 142, as described herein, can be selected as known in the art. Similarly, etching, etching time, and etching condition to etch the materials (e.g., 122; and 226 but not 142 due to capillary effect, can be selected as known in the art).

In some cases, the etched used to remove material 122 may be selected to be able to etch height H3 of material 122 at surfaces 122 and 124 to remove the entire width W1 of material 122 and width and height H3. This etch may not be selected to etch only a certain amount of material 142 due to the capillary effect, but may be selected to etch any of material 142 at a rate much slower, such as 20, 50, 100, or 1000 times slower than it etches material 122, given the same exposed area for the etching. On the other hand, for etching material 226, and etching may be selected that etches a same surface area of material 226 and 142, at the same speed, over the same period of time. However, due to height H4 being at least twice to three times larger than H4, width W1 of material 226 is etched away within height H3, while only 1, 2, or 5 nanometers of width W1 of height H4 of material 142 is etched away along surfaces 152 and 153, for the same length of material 126 and 142, over the same, during the simultaneous etch of 226 and 142.

According to some embodiments, the process of FIG. 3 or 4 may include forming a type III-V semiconductor nanowire 150 or stack 250 (e.g., a "quad-gate" device) using a trench etched out via type III-V semiconductor hetero junction etch that includes etch selectivity and capillary effects. In some embodiments, the process of FIG. 3 or 4, nanowire 150 or stack 250 provide benefits of: (1) enabling a gate to be formed all around the channel or stack; while removing a defective material area in the trench through which transistor leakage may occur (e.g., due to leakage through the sub-fin defective material); (2) selecting an etch that considers use of the Capillary effect to enable filling of a trench with type III-V material of choice for best trench fill and best material growth instead of other factors because the etch will remove the material filled into the trench, so that material can be selected to ensure fewer crystalline defects in the channel due to more versatile selection of the material based on the fill and growth; (3) Enabling cladding of nanowires or stacks with various type III-V gate or buffer material films to increase or optimize carrier mobility and gate material interface properties; (4) allows use of multiple etch selectivities between type III-V materials to provide a broad range of channel material choices, cladding choices, and sub-fin material choices; and (5)

Transistors that include nanowire 150 or stack 250 may be used in high performance logic and memory transistors, high mobility channels (e.g., III-V channel formed on Si substrate) and further Moore's law and at the same time provide low leakage transistors for low power benefits. Transistors that include nanowire 150 or stack 250 may also be used as transistors for High Volume Architecture, computer system architecture features and interfaces made in high volumes. In some implementations, such transistors may includes a number of nanowire 150 or stack 250 that are stacked on top of each other (e.g., vertically in the height direction), such as a stack of 2, 3, 4 or 5 of such devices. In some cases, the stack of devices may be used to form a single transistor (e.g., where each wire conducts a portion of the total channel carriers or current between the same two attached or electrically connected junction regions. Each nanowire 150 or stack 250 in the stack may have a different or the same gate structure.

FIG. 5 shows a flow diagram of an example process 500 for forming a high mobility nanowire "quad-gate" device on or over a silicon substrate by using a sacrificial sub-fin material. Process 500 may include forming a High Mobility Nanowire metal oxide semiconductor from a fin channel grown from a Si Substrates by removing one or more Sacrificial Sub-Fin layers, such as described for forming nanowire 150 or stack 250 in FIGS. 2-4.

Process 500 begins at optional block 505, where a layer of amorphous STI material is formed around a silicon fin formed from a (100) crystal index silicon substrate material of a silicon substrate. Block 505 may include growing the STI material from (e.g., formed on) a (100) crystal index silicon top substrate surface material of a silicon substrate. the STI material may optionally grow from (110) crystal index silicon side substrate surfaces of the fin. Block 505 may include descriptions for FIG. 1. Block 505 may include forming fin 109 and STI regions 107 and 108 of material 104.

At optional block 510, an upper trench is etched (e.g., formed) through the silicon fin in the layer of STI material and defining a first and a second STI region. Block 510 may include descriptions for FIG. 2. Block 510 may include etching fin 109 to form trench 105 having height H1 plus Hs through material 102 of the fin. Block 510 may include forming the upper trench to have a first and a second shallow trench isolation (STI) regions 107 and 108 on a (100) crystal index silicon top substrate surface material of a silicon substrate, the first and the second STI regions having vertical first and second STI inner sidewalls of STI amorphous material defining the upper trench.

At optional block 520, a lower trench is formed below the upper trench and into the silicon substrate. Optional block 520 may include etching a lower trench (e.g., formed) through the flat surface height of the substrate (and bottom of the silicon fin if needed). Optional block 520 may include etching a lower trench below a height of the layer of shallow trench isolation (STI) material, below the upper trench and into the silicon substrate. Block 520 may include descriptions for FIG. 2. Block 520 may include etching trench 106 having height H2 through material 102. Block 520 may include forming the lower trench to have a first and a second substrate inner sidewalls of substrate material defining a lower trench having a (111) crystal index substrate material angled sidewalls. Block 520 may include forming substrate inner sidewalls meeting at a bottom of the lower trench and forming an inward V angle of between 123 and 128 degrees. Block 520 may include forming a lower opening of the upper trench extending into an upper opening of the lower trench. Block 520 may include forming a lower opening of the upper trench extending into the lower trench so that STI sidewalls join first and second substrate inner sidewalls.

Block 530, includes epitaxially growing from the first and a second (111) crystal index substrate inner sidewalls, at least one sub-fin buffer layer of fin sacrificial material in the lower and upper trenches. Block 530 may include descriptions for growing material 122 having height H3 above height H1 of FIG. 3A. Block 530 may include descriptions for growing material 222 and material 226 having height H3 above height H1 of FIG. 4A. Block 530 may include epitaxially growing, at least one sub-fin buffer layer of fin sacrificial material from the first and a second substrate inner sidewalls, but not grow from STI material.

Block 530 may include growing a sub-fin buffer layer of a fin sacrificial material of a first material through the lower and upper trenches and extending above height H1 by at least 20 nanometers; between 20 and 50 nm; between 20 and 100 nm; or by 50 nm. Block 530 may include growing a first sub-fin buffer layer of fin sacrificial material of a first material through the lower trench and into a partial height of the upper trench; then growing a second sub-fin buffer layer of fin sacrificial material of a different second material from the first material and extending above height H1 by at least 20 nanometers; between 20 and 50 nm; between 20 and 100 nm; or by 50 nm.

Block 540, includes epitaxially growing from the sacrificial material(s), at least one fin channel layer of fin channel material from a top surface of the sub-fin buffer layer(s). Block 540, may include epitaxially growing from the top (100) crystal index substrate surface of the at least one sub-fin buffer layer of fin sacrificial material, a fin channel layer of a High Mobility fin channel material. The fin channel material may be a single metal oxide semiconductor channel material or a stack of three layers of metal oxide semiconductor channel materials that form a quantum well.

Block 540, may include epitaxially growing the at least one fin channel layer of fin channel material to have a height of less than 20 nanometers; less than 10 nm, between 10 and 5 nm; between 5 and 2 nm; or 10 nm above the top surface of the at least one sub-fin buffer layer. Block 540 may include descriptions for growing material 142 having height H4 above surfaces 125 of FIG. 3A (e.g., as a channel layer of the second type of material). Block 540 may include descriptions for growing materials 228, 142 and 244 having heights H41, H4 and H41 above surfaces 215 of FIG. 4A (e.g., as a channel stack of the first, then second then first types of material). Block 540, may include epitaxially growing the at least one fin channel layer between a first and a second junction region of material over the upper trench.

Optional block 545 may include selectively etching the amorphous STI material to remove a selected height of the STI regions and to expose a height of the sacrificial sub-fin material that can be etched. Optional block 545 may include descriptions for etching to expose selected height H3 of material 122 in FIGS. 3A-B or material 226 in FIGS. 4A-B. Block 520 may include descriptions for FIG. 3B or 4B. Optional block 545 may include etching the STI regions above the semiconductor substrate of FIG. 3A or 4A to remove a height HS of them and to expose a height of the sacrificial sub-fin material that can be etched. The etch may expose selected height H3 of the sacrificial sub-fin material 122 or 226 that is a sufficient height that can be etched as noted herein. This etch may also expose materials above those sub-fin materials, such as material 142 and/or materials of stack 250, or nanowire 150.

Block 550, includes selectively etching to remove the sub-fin buffer layer(s) of fin sacrificial material from below the fin channel layer(s) of fin channel material(s), but not to remove the fin channel material(s), to leave a nanowire of the fin channel material(s) suspended above the upper trench.

Block 550 may include selectively etching at least one sub-fin buffer layer of fin sacrificial material from above the upper trench or extending above top surfaces of the STI regions by a portion or all of the height H3 that can be etched. Block 550 may include descriptions for selectively etching material 122 of FIG. 3C. Block 550 may include descriptions for selectively etching material 226 of FIG. 4C.

Block 550 may include selecting an etch chemistry and time that is known to (1) selectively etch the type of material of the at least one sub-fin buffer layer based on the selected etch chemistry and height H3 of exposed sides of the at least one sub-fin buffer layer; but (2) leave the type of material of the at least one channel layer based on the selected etch chemistry. Block 550 may include selecting an etch chemistry and time that will remove all of the first buffer layer.

In some cases, block 550 may include selecting an etch chemistry and time that is known to (1) selectively etch the type of material of the at least one sub-fin buffer layer based on the selected etch chemistry and a selected height H3 of exposed sides of the at least one sub-fin buffer layer; (2) selectively etch the type of material of a middle channel material of a stack of three channel materials, based on the selected etch chemistry; but (3) leave the type of material of the two thin layer channel materials of the stack that are above and below the middle channel material of a stack based on the selected etch chemistry; and (4) not etching to remove the middle channel material of a stack due to the capillary effect which prohibits etching of the middle channel material because a selected height H4 of exposed sides of the middle channel material is not large enough for the selected etch (e.g., anisotropic wet etch with the selected chemistry for the selected time) to etch more than a few nanometers of width of the middle channel material.

In some cases, block 550 or a separate subsequent etch removes all of the at least one sub-fin buffer layers, based on a selected etch chemistry. In some cases, block 550 or a separate subsequent etch removes all of the two thin layer channel materials of the stack that are above and below the middle channel material, based on a selected etch chemistry. In some cases, a second of the at least one sub-fin buffer layers; and the two thin layer channel materials of the stack that are above and below the middle channel material are removed together, based on a selected etch chemistry.

In some cases, only block 550 is performed. In some cases, only blocks 545 and 550 are performed. In some cases, only blocks 540 and 550 are performed. In some cases, only blocks 530 to 550 are performed. In some cases, only blocks 510 to 550 are performed. In some cases, all of blocks 505 to 550 are performed.

In some cases, the first material is indium phosphate (InP) and the second material is indium gallium arsenide (InGaAs). In some cases, the first material is silicon (Si) and the second material is silicon germanium (SiGe). In some cases, the first material is silicon (Si) and the second material is germanium (Ge). In some cases, the first material is silicon germanium (SiGe) and the second material is germanium (Ge). In some cases, the selected etch chemistry can be selected to etch the first material of the first buffer layer but not the second material of the first channel layer, as known in the art to perform the processes described herein. In some cases, the selected etch chemistry can be selected to etch the second material of the second buffer layer but not the first material of the thin channel layers or the second material of the second channel layer due to the capillary effect, as known in the art to perform the processes described herein.

Figure 6:
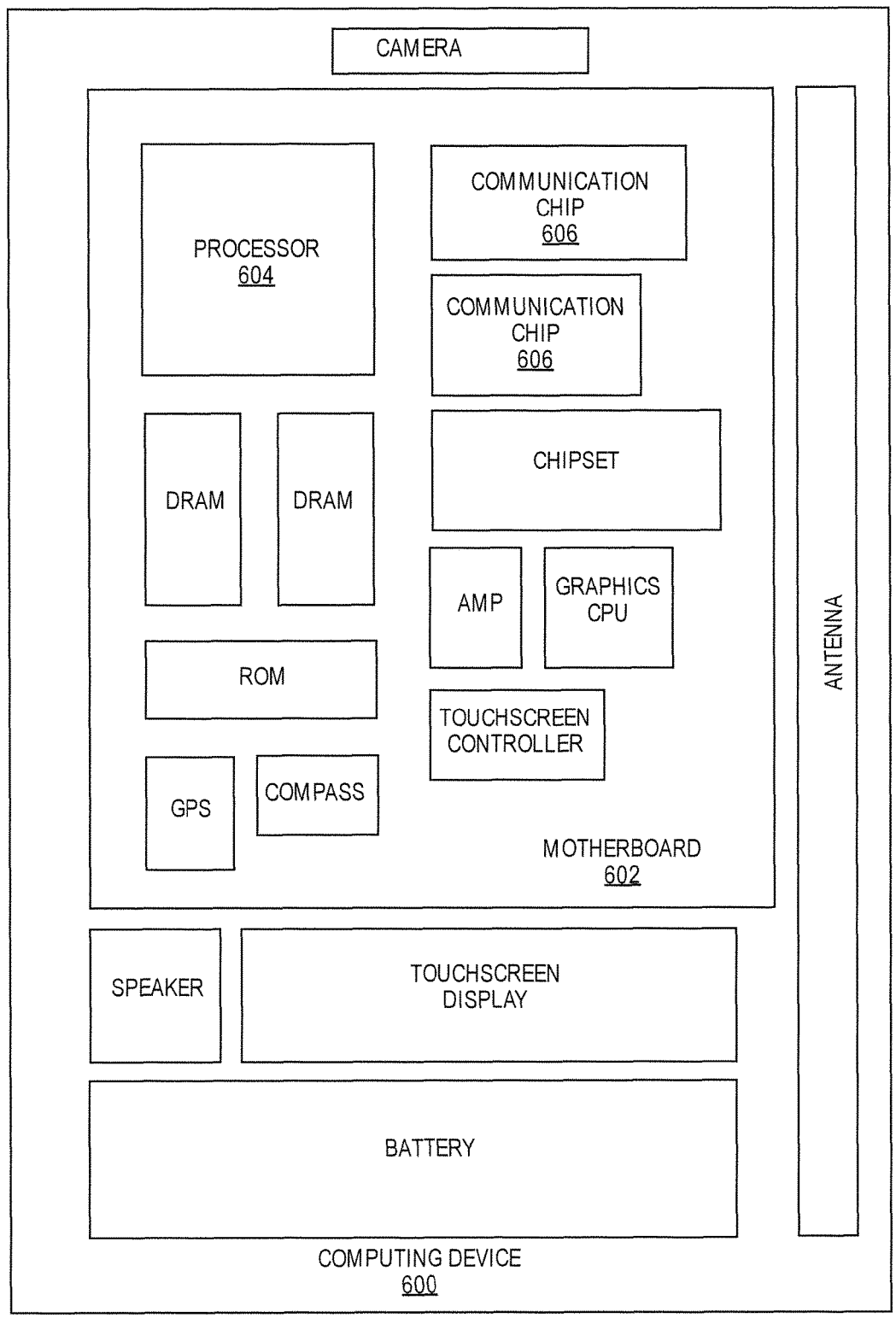
FIG. 6 illustrates a computing device in accordance with one implementation.

FIG. 6 illustrates a computing device 600 in accordance with one implementation. The computing device 600 houses board 602. Board 602 may include a number of components, including but not limited to processor 604 and at least one communication chip 606. Processor 604 is physically and electrically connected to board 602. In some implementations at least one communication chip 606 is also physically and electrically connected to board 602. In further implementations, communication chip 606 is part of processor 604.

Depending on its applications, computing device 600 may include other components that may or may not be physically and electrically connected to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die includes a quad-gate device having nanowire of channel material(s) (e.g., single material or stack) formed by removing a portion of a sub-fin material from below the channel material, where the sub-fin material was grown in an aspect ration trapping (ART) trench as described with reference to FIGS. 1-5. In some implementations, the integrated circuit die includes a number of quad-gate devices that are stacked on top of each other (e.g., vertically in the height direction), such as a stack of 2, 3, 4 or 5 of such devices. In some cases, the stack of devices may be used to form a single transistor (e.g., where each wire conducts a portion of the total channel carriers or current between the same two attached or electrically connected junction regions. Each wire may have a different or the same gate structure. The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, a package including a communication chip incorporates one or more quad-gate devices having a nanowire of channel material(s) such as described herein. In further implementations, another component housed within computing device 600 may contain a microelectronic package including a fin device having cladding device layers such as described above.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments.

Example 1 is a method of forming a nanowire channel on a silicon substrate using a sacrificial sub-fin layer, comprising: epitaxially growing from a first and a second substrate inner sidewall, a sub-fin buffer layer of fin sacrificial material in a trench formed between shallow trench isolation (STI) regions; epitaxially growing from the sacrificial material a second height of a fin channel layer of fin channel material in the trench; selectively etching the STI regions to remove a height of the STI regions and to expose a first height of the sacrificial sub-fin material that can be etched above top surfaces of the etched shallow trench isolation (STI) regions; and selectively etching to remove the first height of the sub-fin buffer layer of fin sacrificial material from below the fin channel layer, but leave the second height of the fin channel layer of fin channel material, to form a nanowire of the fin channel layer of fin channel material above the trench.

In Example 2, the subject matter of Example 1 can optionally include wherein the first height is between 20 and 50 nanometers.

In Example 3 the subject matter of Example 2 can optionally include wherein the second height is between 5 and 10 nanometers (nm) and the fin channel layer of fin channel material includes a first thin fin channel layer of a first fin channel material, a second fin channel layer of a second fin channel material, a third thin fin channel layer of the first fin channel material.

In Example 4 the subject matter of Example 1 can optionally include wherein epitaxially growing a second height of a fin channel layer of fin channel material includes epitaxially growing the fin channel layer from a top surface of the sub-fin buffer layer; and wherein selectively etching to remove the first height leaves a nanowire quad-gate channel of the fin channel layer suspended between a first and a second junction region of material formed at the ends of the upper.

In Example 5 the subject matter if Example 1 can optionally include wherein the first and the second substrate inner sidewalls are (111) crystal index substrate material, and wherein growing the sub-fin buffer layer of fin sacrificial material includes growing the sub-fin buffer layer of fin sacrificial material from (111) crystal index substrate material, but not from STI material, to reduce defects at a top surface of the sub-fin buffer layer of fin sacrificial material.

In Example 6 the subject matter if Example 1 can optionally further include forming the trench prior to epitaxially growing the sub-fin buffer layer of fin sacrificial material, wherein forming the trench comprises; forming a layer of amorphous STI material on a (100) crystal index silicon top substrate surface material of a silicon substrate and around a silicon fin of the substrate material; etching an upper trench through the silicon film to the substrate top substrate surface material, the upper trench defining a first and a second STI region having STI top surfaces and vertical first and second STI inner sidewalls of STI amorphous material; and etching a lower trench below the upper trench and into the substrate top substrate surface material, wherein the lower trench includes a first and a second substrate inner sidewalls of substrate material defining the lower trench and having a (111) crystal index substrate material angled sidewalls.

In Example 7 the subject matter of Example 1 can optionally include wherein forming the sub-fin buffer layer of fin sacrificial material includes: epitaxially growing a first buffer layer of a first material from the first and a second substrate inner sidewalls, the first buffer layer extending through the lower and upper trench, and extending the first height above top surfaces of shallow trench isolation (STI) regions.

In Example 8 the subject matter of Example 7 can optionally include wherein selectively etching to remove the first height includes selecting an isotropic wet etch chemistry to etch the first material of the first buffer layer but not the second material of the first channel layer.

In Example 9 the subject matter of Example 7 can optionally include wherein (1) the first material is indium phosphate (InP) and the second material is indium gallium arsenide (InGaAs); or (2) the first material is silicon (Si) and the second material is silicon germanium (SiGe); and further comprising a layer of gate dielectric or buffer material formed on four exposed surfaces of the nanowire.

In Example 10 the subject matter of Example 1 can optionally include wherein forming the sub-fin buffer layer of fin sacrificial material includes: forming the sub-fin buffer layer of fin sacrificial material includes: epitaxially growing a second buffer layer of a second material from a top surface of the first buffer layer and extending the first height above the top surfaces of the STI regions.

In Example 11 the subject matter of Example 10 can optionally include wherein forming the fin channel layer of fin channel material includes: epitaxially growing a first channel layer of the first material from a top surface of the second buffer layer; epitaxially growing a second channel layer of the second material from a top surface of the first channel layer; and epitaxially growing a third channel layer of the first material from a top surface of the second channel layer.

In Example 12 the subject matter of Example 11 can optionally include wherein selectively etching to remove the sub-fin buffer layer of fin sacrificial material includes: selectively etching to (1) remove the second material of the second buffer layer, (2) but not etch the first material of the first buffer, the first channel and the third channel layer, to form the nanowire as a stack of the first, second and third channel layers; and (3) not etch the second material of the second channel layer due to a capillary effect of no lateral etch of the second channel layer.

In Example 13 the subject matter of Example 11 can optionally include wherein selectively etching to remove the first height includes selecting an isotropic wet etch chemistry to etch the second material of the second buffer layer but not the first material of the thin channel layers and not to remove the second material of the second channel layer due to a capillary effect of the etch being unable to etch the second thickness of the second channel layer.

In Example 14 the subject matter of Example 12 can optionally further include, after selectively etching to remove the sub-fin buffer layer of fin sacrificial material, then, selectively etching to (1) remove the first material of the first buffer layer, the first channel layer and the third channel layers, but leave the second material of the second channel layer, to form the nanowire of the second channel layer.

In Example 15 the subject matter of Example 12 can optionally include wherein (1) the first material is indium phosphate (InP) and the second material is indium gallium arsenide (InGaAs); or (2) the first material is silicon (Si) and the second material is silicon germanium (SiGe); and further comprising a layer of gate dielectric or buffer material formed on four exposed surfaces of the stack.

Example 16 is a nanowire channel formed on a silicon substrate using a sacrificial sub-fin layer, comprising: a silicon substrate having a first and the second substrate region having a first and a second substrate inner sidewalls of substrate material at an angle, defining a lower trench and having a (111) crystal index, the lower trench having a lower trench upper opening; a first and a second shallow trench isolation (STI) region on the first and the second substrate regions, the first and the second STI regions having vertical first and second STI inner sidewalls of STI material defining an upper trench over the lower trench upper opening and having a (110) crystal index; and a nanowire of fin channel material suspended over the upper trench between a first and a second junction region material.

In Example 17 the subject matter of Example 16 can optionally include wherein the nanowire has a height of less than 10 nanometers and is at least 20 nanometers above a top surface of the STI; and wherein the nanowire forms a quad-channel or a quad quantum well.

In Example 18 the subject matter of Example 16 can optionally include wherein (1) the channel material indium gallium arsenide (InGaAs) or silicon germanium (SiGe); and further comprising a layer of gate dielectric or buffer material formed on four exposed surfaces of the nanowire.

Example 19 is a system for computing comprising: microprocessor coupled to a memory, the microprocessor having at least one electronic quad gate device having: a silicon substrate having a first and the second substrate region having a first and a second substrate inner sidewalls of substrate material at an angle, defining a lower trench and having a (111) crystal index, the lower trench having a lower trench upper opening; a first and a second shallow trench isolation (STI) region on the first and the second substrate regions, the first and the second STI regions having vertical first and second STI inner sidewalls of STI material defining an upper trench over the lower trench upper opening and having a (110) crystal index; a nanowire of fin channel material suspended over the upper trench between a first and a second junction region material.

In Example 20 the subject matter of Example 19 can optionally include wherein the nanowire has a height of less than 10 nanometers and is at least 20 nanometers above a top surface of the STI; and wherein the nanowire forms a quad-channel or a quad quantum well.

In Example 21 the subject matter of Example 19 can optionally include wherein (1) the channel material indium gallium arsenide (InGaAs) or silicon germanium (SiGe); and further comprising a layer of gate dielectric or buffer material formed on four exposed surfaces of the nanowire.

Example 22 is an apparatus comprising a means for preforming the method of any one of claims 1-15.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects of embodiments. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming quad-gate devices having a nanowire of channel material(s) only show up to two sacrificial buffer layers, and up to 3 channel "stack" layers, the descriptions and figures above can be applied to forming more than two sacrificial buffer layers (e.g., 3 or 4 of them), and/or more than 3 channel "stack" layers (e.g., 4 or 5 of them). Thus, the claims following the Detailed Description are hereby expressly incorporated into this Detailed Description, with each claim standing on its own as a separate embodiment of the invention.

The invention claimed is:

1. A method of forming a nanowire channel on a silicon substrate using a sacrificial sub-fin layer, comprising:
    epitaxially growing from a first and a second substrate inner sidewall, a sub-fin buffer layer of fin sacrificial material in a trench formed between shallow trench isolation (STI) regions;
    epitaxially growing from the sacrificial material a second height of a fin channel layer of fin channel material in the trench;
    selectively etching the STI regions to remove a height of the STI regions and to expose a first height of the sacrificial sub-fin material that can be etched above top surfaces of the etched STI regions;
    selectively etching to remove the first height of the sub-fin buffer layer of fin sacrificial material from below the fin channel layer, but leave the second height of the fin channel layer of fin channel material, to form a nanowire of the fin channel layer of fin channel material above the trench in the STI regions; and
    forming a gate electrode around the nanowire of the fin channel layer, the gate electrode having a portion beneath a bottom of the nanowire of the fin channel layer, the portion of the gate electrode beneath the bottom of the nanowire of the fin channel layer having a bottom surface above and over a top surface of the trench in the STI regions.

2. The method of claim 1, wherein the first height is between 20 and 50 nanometers (nm).

3. The method of claim 2, wherein the second height is between 5 and 10 nanometers (nm) and the fin channel layer of fin channel material includes a first thin fin channel layer of a first fin channel material, a second fin channel layer of a second fin channel material, a third thin fin channel layer of the first fin channel material.

4. The method of claim 1, wherein epitaxially growing a second height of a fin channel layer of fin channel material includes epitaxially growing the fin channel layer from a top surface of the sub-fin buffer layer; and wherein selectively etching to remove the first height leaves a nanowire quadgate channel of the fin channel layer suspended between a first and a second junction region of material formed at the ends of the upper.

5. The method of claim 1, wherein the first and the second substrate inner sidewalls are (111) crystal index substrate material, and wherein growing the sub-fin buffer layer of fin sacrificial material includes growing the sub-tin buffer layer of fin sacrificial material from (111) crystal index substrate material, but not from STI material, to reduce defects at a top surface of the sub-fin buffer layer of fin sacrificial material.

6. The method of claim 1, further comprising: forming the trench prior to epitaxially growing the sub-fin buffer layer of fin sacrificial material, wherein forming the trench comprises;
 forming a layer of amorphous STI material on a (100) crystal index silicon top substrate surface material of a silicon substrate and around a silicon fin of the substrate material;
 etching an upper trench through the silicon film to the substrate top substrate surface material, the upper trench defining a first and a second STI region having STI top surfaces and vertical first and second STI inner sidewalls of STI amorphous material; and
 etching a lower trench below the upper trench and into the substrate top substrate surface material, wherein the lower trench includes a first and a second substrate inner sidewalls of substrate material defining the lower trench and having a (111) crystal index substrate material angled sidewalls.

7. The method of claim 1, wherein forming the sorb-fin buffer layer of fin sacrificial material includes:
 epitaxially growing a first buffer layer of a first material from the first and a second substrate inner sidewalls, the first buffer layer extending through the lower and upper trench, and extending the first height above top surfaces of shallow trench isolation (STI) regions.

8. The method of claim 7, wherein selectively etching to remove the first height includes selecting an isotropic wet etch chemistry to etch the first material of the first buffer layer but not the second material of the first channel layer.

9. The method of claim 7, wherein (1) the first material is indium phosphate (InP) and the second material is indium gallium arsenide (InGaAs); or (2) the first material is silicon (Si) and the second material is silicon germanium (SiGe); and further comprising a layer of gate dielectric or buffer material formed on four exposed surfaces of the nanowire.

10. The method of claim 1, wherein forming the sub-fin buffer layer of fin sacrificial material includes:
 epitaxially growing a first buffer layer of a first material from the first and second substrate inner sidewalls, into a portion of the height of the upper trench; and
 epitaxially growing a second buffer layer of a second material from a top surface of the first buffer layer and extending the first height above the top surfaces of the STI regions.

11. A method of forming a nanowire channel on a silicon substrate using a sacrificial sub-fin layer, comprising:
 epitaxially growing from a first and a second substrate inner sidewall, a sub-fin buffer layer of fin sacrificial material in a trench formed between shallow trench isolation (STI) regions;
 epitaxially growing from the sacrificial material a second height of a fin channel layer of fin channel material in the trench;
 selectively etching the STI regions to remove a height of the STI regions and to expose a first height of the sacrificial sub-fin material that can be etched above top surfaces of the etched STI regions; and
 selectively etching to remove the first height of the sub-fin buffer layer of fin sacrificial material from below the fin channel layer, but leave the second height of the fin channel layer of fin channel material, to form a nanowire of the fin channel layer of fin channel material above the trench, wherein forming the sub-fin buffer layer of fin sacrificial material includes:
 epitaxially growing a first buffer layer of a first material from the first and second substrate inner sidewalls, into a portion of the height of the upper trench; and
 epitaxially growing a second buffer layer of a second material from a top surface of the first buffer layer and extending the first height above the top surfaces of the STI regions, and, wherein forming the fin channel layer of fin channel material includes:
 epitaxially growing a first channel layer of the first material from a top surface of the second buffer layer;
 epitaxially growing a second channel layer of the second material from a top surface of the first channel layer; and
 epitaxially growing a third channel layer of the first material from a top surface of the second channel layer.

12. The method of claim 11, wherein selectively etching to remove the sub-fin buffer layer of fin sacrificial material includes:
 selectively etching to (1) remove the second material of the second buffer layer, (2) but not etch the first material of the first buffer, the first channel and the third channel layer, to form the nanowire as a stack of the first, second and third channel layers; and (3) not etch the second material of the second channel layer due to a capillary effect of no lateral etch of the second channel layer.

13. The method of claim 11, wherein selectively etching to remove the first height includes selecting an isotropic wet etch chemistry to etch the second material of the second buffer layer but not the first material of the thin channel layers and not to remove the second material of the second channel layer due to a capillary effect of the etch being unable to etch the second thickness of the second channel layer.

14. The method of claim 12, further comprising, after selectively etching to remove the sub-fin buffer layer of fin sacrificial material, then, selectively etching to (1) remove the first material of the first buffer layer, the first channel layer and the third channel layers, but leave the second material of the second channel layer, to form the nanowire of the second channel layer.

15. The method of claim 12, wherein (1) the first material is indium phosphate (InP) and the second material is indium gallium arsenide (InGaAs); or (2) the first material is silicon (Si) and the second material is silicon germanium (SiGe); and further comprising a layer of gate dielectric or buffer material formed on four exposed surfaces of the stack.

16. A nanowire channel formed on a silicon substrate using a sacrificial sub-fin layer, comprising:
   a silicon substrate having a first and the second substrate region having a first and a second substrate inner sidewalls of substrate material at an angle, defining a lower trench and having a (111) crystal index, the lower trench having a lower trench upper opening;
   a first and a second shallow trench isolation (STI) region on the first and the second substrate regions, the first and the second STI regions having vertical first and second STI inner sidewalls of STI material defining an upper trench over the lower trench upper opening and having a (110) crystal index;
   a nanowire of fin channel material suspended over the upper trench between a first and a second junction region material; and
   a gate electrode around the nanowire of fin channel material, the gate electrode having a portion beneath a bottom of the nanowire of fin channel material, the portion of the gate electrode beneath the bottom of the nanowire of fin channel material having a bottom surface above and over a top surface of the upper trench in the first and second STI regions.

17. The device of claim 16, wherein the nanowire has a height of less than 10 nanometers and is at least 20 nanometers above a top surface of the STI; and wherein the nanowire forms a quad-channel or a quad quantum well.

18. The device of claim 16, wherein (1) the channel material indium gallium arsenide (InGaAs) or silicon germanium (SiGe); and further comprising a layer of gate dielectric or buffer material formed on four exposed surfaces of the nanowire.

19. A system for computing comprising: microprocessor coupled to a memory, the microprocessor having at least one electronic quad gate device having:
   a silicon substrate having a first and the second substrate region having a first and a second substrate inner sidewalls of substrate material at an angle, defining a lower trench and having a (111) crystal index, the lower trench having a lower trench upper opening;
   a first and a second shallow trench isolation (STI) region on the first and the second substrate regions, the first and the second STI regions having vertical first and second STI inner sidewalls of STI material defining an upper trench over the lower trench upper opening and having a (110) crystal index;
   a nanowire of fin channel material suspended over the upper trench between a first and a second junction region material; and
   a gate electrode around the nanowire of fin channel material, the gate electrode having a portion beneath a bottom of the nanowire of fin channel material, the portion of the gate electrode beneath the bottom of the nanowire of fin channel material having a bottom surface above and over a top surface of the upper trench in the first and second STI regions.

20. The system of claim 19, wherein the nanowire has a height of less than 10 nanometers and is at least 20 nanometers above a top surface of the STI; and wherein the nanowire forms a quad-channel or a quad quantum well.

21. The system of claim 19, wherein (1) the channel material indium gallium arsenide (InGaAs) or silicon germanium (SiGe); and further comprising a layer of gate dielectric or buffer material formed on four exposed surfaces of the nanowire.

* * * * *